(12) United States Patent
Ogawa et al.

(10) Patent No.: US 10,622,183 B2
(45) Date of Patent: Apr. 14, 2020

(54) MONOCHROMATOR AND CHARGED PARTICLE BEAM APPARATUS COMPRISING THE SAME

(71) Applicant: KOREA RESEARCH INSTITUTE OF STANDARDS AND SCIENCE, Daejeon (KR)

(72) Inventors: Takashi Ogawa, Daejeon (KR); Ju Hwang Kim, Daejeon (KR); In Yong Park, Daejeon (KR)

(73) Assignee: KOREA RESEARCH INSTITUTE OF STANDARDS AND SCIENCE, Daejeon (KR)

( * ) Notice: Subject to any disclaimer, the term of this patent is extended or adjusted under 35 U.S.C. 154(b) by 330 days.

(21) Appl. No.: 15/527,119

(22) PCT Filed: Mar. 24, 2016

(86) PCT No.: PCT/KR2016/002954
§ 371 (c)(1),
(2) Date: May 16, 2017

(87) PCT Pub. No.: WO2017/164439
PCT Pub. Date: Sep. 28, 2017

(65) Prior Publication Data
US 2018/0114672 A1    Apr. 26, 2018

(30) Foreign Application Priority Data
Mar. 23, 2016  (KR) .................. 10-2016-0034683

(51) Int. Cl.
*H01J 37/05* (2006.01)
*H01J 37/02* (2006.01)
(Continued)

(52) U.S. Cl.
CPC ............ *H01J 37/05* (2013.01); *H01J 37/023* (2013.01); *H01J 37/12* (2013.01); *H01J 37/26* (2013.01);
(Continued)

(58) Field of Classification Search
CPC ............... H01J 37/3005; H01J 37/3007; H01J 2237/057; H01J 2237/103;
(Continued)

(56) References Cited

U.S. PATENT DOCUMENTS

| 4,812,652 A * | 3/1989 | Egle ...................... H01J 37/05 250/305 |
| 6,670,611 B1 * | 12/2003 | Kruit ...................... H01J 37/05 250/288 |

(Continued)

FOREIGN PATENT DOCUMENTS

KR    10-1633978 B1    6/2016

OTHER PUBLICATIONS

Ogawa, Takashi, and Boklae Cho. "A new monochromator with multiple offset cylindrical lenses." Nuclear Instruments and Methods in Physics Research Section A: Accelerators, Spectrometers, Detectors and Associated Equipment 772 (Feb. 2015): 5-13 (Year: 2015).*

(Continued)

*Primary Examiner* — Wyatt A Stoffa
(74) *Attorney, Agent, or Firm* — Knobbe Martens Olson & Bear LLP

(57) ABSTRACT

The present invention relates to a charged particle beam apparatus enabling a selection of a charged particle beam in a specified energy range by symmetrically arranging cylindrical electrostatic lenses deflecting a path of the charged particle beam and disposing an energy selection aperture between the cylindrical electrostatic lenses. Since an integral (Continued)

structure in which a central electrode and a plurality of electrodes that are arranged at a front portion and a rear portion in relation to the central electrode of a monochromator are fixed to each other through insulator, is applied, a mechanism for adjusting an offset with respect to an optical axis is simplified as compared to the case of separately providing the lenses at the front portion and the rear portion, respectively, and a secondary aberration is canceled in an exit plane due to symmetry of an optical system.

22 Claims, 16 Drawing Sheets

(51) Int. Cl.
    *H01J 37/12*     (2006.01)
    *H01J 37/26*     (2006.01)
    *H01J 37/28*     (2006.01)
    *H01J 37/30*     (2006.01)
    *H01J 37/305*     (2006.01)

(52) U.S. Cl.
    CPC ........... *H01J 37/28* (2013.01); *H01J 37/3005* (2013.01); *H01J 37/3007* (2013.01); *H01J 37/3053* (2013.01); *H01J 2237/03* (2013.01); *H01J 2237/053* (2013.01); *H01J 2237/057* (2013.01); *H01J 2237/103* (2013.01); *H01J 2237/12* (2013.01); *H01J 2237/2802* (2013.01)

(58) Field of Classification Search
    CPC .... H01J 2237/2802; H01J 37/28; H01J 37/26; H01J 2237/0453; H01J 37/05; H01J 2237/0458; H01J 37/023; H01J 37/12; H01J 2237/03; H01J 2237/053; H01J 2237/12
    See application file for complete search history.

(56) References Cited

U.S. PATENT DOCUMENTS

| | | | | |
|---|---|---|---|---|
| 8,853,616 B2* | 10/2014 | Mukai | ............. | H01J 37/023 250/252.1 |
| 9,111,715 B2* | 8/2015 | Parker | ............. | H01J 37/05 |
| 10,037,866 B2* | 7/2018 | Enyama | ............. | H01J 37/222 |
| 2001/0052744 A1* | 12/2001 | Tsuno | ............. | H01J 37/05 313/364 |
| 2007/0069150 A1* | 3/2007 | Frosien | ............. | H01J 37/05 250/396 ML |
| 2007/0125954 A1* | 6/2007 | Frosien | ............. | H01J 37/02 250/396 R |
| 2009/0218506 A1* | 9/2009 | Nakasuji | ............. | H01J 37/05 250/396 ML |
| 2012/0318978 A1* | 12/2012 | Ren | ............. | H01J 37/05 250/310 |
| 2013/0248699 A1* | 9/2013 | Mukai | ............. | H01J 37/023 250/252.1 |
| 2015/0060666 A1* | 3/2015 | Hatakeyama | ............. | H01J 37/244 250/307 |
| 2015/0371811 A1* | 12/2015 | Ogawa | ............. | H01J 37/21 250/305 |
| 2016/0079030 A1* | 3/2016 | Mukai | ............. | H01J 37/21 250/305 |
| 2016/0111247 A1* | 4/2016 | Potocek | ............. | H01J 37/21 250/307 |
| 2017/0221673 A1* | 8/2017 | Sed'a | ............. | H01J 37/05 |
| 2018/0114672 A1* | 4/2018 | Ogawa | ............. | H01J 29/62 |

OTHER PUBLICATIONS

Ogawa, Takashi, and Boklae Cho. "A new monochromator with multiple offset cylindrical lenses." Nuclear Instruments and Methods in Physics Research Section A: Accelerators, Spectrometers, Detectors and Associated Equipment 772 (2015): 5-13 (Year: 2015).*

* cited by examiner

MONOCHROMATOR AND CHARGED PARTICLE BEAM APPARATUS COMPRISING THE SAME

TECHNICAL FIELD

The present invention relates to a charged particle beam apparatus including a monochromator, and more particularly, to a charged particle beam apparatus enabling a selection of a charged particle beam in a specified energy range by symmetrically arranging cylindrical electrostatic lenses deflecting a path of the charged particle beam and disposing an energy selection aperture between the cylindrical electrostatic lenses.

BACKGROUND ART

Moving charged particles may change their paths by an electrostatic field or a magnetic field, thus a charged particle path control apparatus that serves to control a propagation direction of a charged particle beam in which several charged particles move together, or focus or spread the charged particle beam, is called a charged particle optical system, which refers to an optical system controlling a path of light.

The charged particle beam includes an ion beam and an electron beam. The ion beam is mainly a positive ion beam, and extracted from a plasma ion source, a gas field ion source, or a liquid metal ion source, and the electron beam is obtained from a cathode. The electron beam is obtained from a schottky electron source in which zirconia oxide (ZrO) is coated on a tungsten (W) surface, or a cold field emission electron source including tungsten. In the ion beam and the electron beam, ions or electrons out of a predetermined energy range that ions or electrons forming a beam averagely have are present, and paths of such ions and electrons are out of a desired path range in the charged particle optical system controlled based on the predetermined energy range.

A monochromator selecting a particle of a specified energy range in the charged particle beam and removing a particle having energy out of the range, includes a Wien filter monochromator using an electric field and a magnetic field together, an electrostatic field monochromator making the charged particle beam to perform a circular movement in an electrostatic field, and a Mollenstedt energy analyzer monochromator in which propagating charged particle beam is incident on an asymmetric electrostatic field to move a path, or the like.

Here, the cylindrical lens is configured of three electrodes having a rectangular opening at the center thereof. A center electrode is applied with high voltage, two front and rear electrodes are charged particle lenses that is applied with ground voltage, and an insulation material is provided between the three electrodes. Energy of the charged particle is decelerated to almost 0 around the center electrode applied with high voltage, a component passing through an outside of an optical axis of the lens is selected, the energy of the charged particle is analyzed by using energy dispersion occurring by chromatic aberration of an axis of lens. In the monochromator, the off-axis component of the charged particle source is filtered by the energy selection aperture, energy is divided by passing light through the outside of the axis of the electrostatic lens to select only a mean energy part. The monochromator may be used in the charged particle beam apparatus such as a scanning electron microscope (SEM). The monochromator reduces an influence of chromatic aberration of the charged particle beam to thereby improve image resolving power.

Korean Patent Laid-Open Publication No. 10-2015-0146079 relates to a monochromator and a charged particle beam apparatus including the same, and discloses a technology for a monochromator including two electrostatic lenses each including a plurality of electrodes, and an energy selection aperture provided therebetween. However, in Korean Patent Laid-Open Publication No. 10-2015-0146079, a center of a rectangular opening of the two rectangular electrostatic lenses needs to be separately offset with respect to an optical axis of the charged particle beam, and the number of electrodes configuring the electrostatic lens is large, thus it is complicated to precisely match openings of the electrodes.

RELATED ART DOCUMENT

Patent Document

Korean Patent Laid-Open Publication No. 10-2015-0146079

DISCLOSURE

Technical Problem

The present invention has been suggested to solve the above problems according to the related art, and an object of the present invention is to provide a monochromator that decreases energy spreading of a charged particle beam that may be spread by using a electrostatic lens having an integral structure including a plurality of electrodes of which rectangular openings are matched to each other, and a charged particle beam apparatus including the same.

Technical Solution

In one general aspect, there is provided a monochromator, including: a center electrode having a rectangular opening and having an energy selection aperture selectively passing a particle belonging to a predetermined energy range in a charged particle beam incident while having energy distribution therethrough at a center of a thickness in the rectangular opening; a plurality of electrodes each having a rectangular opening respectively so that the incident charged particle beam passes therethrough and each arranged in parallel at a front portion and at a rear portion in relation to the center electrode; a control power source part applying power so that the openings of the plurality of electrodes each arranged at the front portion and the rear portion function as an electrostatic lens; and a position adjustment part adjusting position of the center electrode and the plurality of electrodes so that a center in a short-side direction of the rectangular opening is offset by a predetermined distance from a central axis of the incident charged particle beam, to allow the plurality of electrodes arranged at the front portion to function as the electrostatic lens to deflect the incident charged particle beam in one direction and to allow the plurality of electrodes arranged at the rear portion to function as the electrostatic lens to deflect again the charged particle beam that is deflected in one direction to an original position to emit the charged particle beam, in which the central electrode and the plurality of electrodes have an integral structure in which they are fixed to each other through insulator.

The number of the plurality of electrodes disposed at the front portion and the number of the plurality of electrodes disposed at the rear portion of the center electrode may be two, respectively, and the plurality of electrodes disposed at the front portion and the rear portion of the center electrode may have a symmetric structure in relation to the center electrode, and be integrally fixed.

In another general aspect, there is provided a charged particle beam apparatus including a monochromator, the charged particle beam apparatus including: a charged particle source emitting a charged particle beam; a filament applying a current $I_{fil}$ heating the charged particle source; a suppressor suppressing electronic radiation in an arbitrary direction from the charged particle source; an extractor applying an extraction voltage $V_{ext}$ to the charged particle source; first transfer lens (first axially symmetric lens) parts focusing and passing the charged particle beam passing through the extractor and including a plurality of electrodes each having an opening; an entrance aperture spaced apart from the first transfer lens parts in a propagation direction of the charged particle beam and limiting an incident angle of the charged particle beam passing through the first transfer lens to be in a predetermined range; the monochromator selectively passing a charged particle beam of a predetermined energy range in the charged particle beam passing through the entrance aperture; second transfer lens (second axially symmetric lens) parts focusing and passing the charged particle beam passing through the monochromator and including a plurality of electrodes each having an opening; a charged particle beam exit electrode emitting the charged particle beam passing through the second transfer lens and grounded; an optical system having charged particle beam lenses, deflection systems, and astigmatism correction apparatuses at a rear of the monochromator; a sample onto which the charged particle beam is irradiated and a sample chamber having the sample mounted therein; a detector detecting the charged particle beam emitted from the sample through irradiation of the charged particle beam; and a controller, in which the charged particle source, the suppressor, the extractor, the first transfer lens part, the entrance aperture, the monochromator, the second transfer lens, the optical system, the sample chamber, and the detector are maintained in a vacuum state through a vacuum pump, and the monochromator includes a center electrode having a rectangular opening and having an energy selection aperture selectively passing a particle belonging to a predetermined energy range in a charged particle beam incident while having energy distribution therethrough at a center of a thickness in the rectangular opening; a plurality of electrodes each having a rectangular opening respectively so that the incident charged particle beam passes therethrough and each arranged in parallel at a front portion and at a rear portion in relation to the center electrode; a power source part applying power so that the openings of the plurality of electrodes each arranged at the front portion and the rear portion function as an electrostatic lens; and a position adjustment part adjusting position of the center electrode and the plurality of electrodes so that a center in a short-side direction of the rectangular opening is offset by a predetermined distance from a central axis of the incident charged particle beam, to allow the plurality of electrodes arranged at the front portion to function as the electrostatic lens to deflect the incident charged particle beam in one direction and to allow the plurality of electrodes arranged at the rear portion to function as the electrostatic lens to deflect again the charged particle beam that is deflected in one direction to an original position to emit the charged particle beam, in which the central electrode and the plurality of electrodes have an integral structure in which they are fixed to each other through insulator.

The charged particle source, the suppressor, the extractor, and the first transfer lens part may be disposed in an ultrahigh vacuum chamber that is separated from the monochromator, and the separated ultrahigh vacuum space may maintain an ultrahigh vacuum state through a separate vacuum pump.

The charged particle beam apparatus may further include a counter electrode spaced apart from the second transfer lens part in the propagation direction of the charged particle beam and facing the second transfer lens part between the second transfer lens and the charged particle beam exit electrode.

The number of the plurality of electrodes disposed at the front portion and the number of the plurality of electrodes disposed at the rear portion of the center electrode may be two, respectively, the plurality of electrodes disposed at the front portion and the rear portion of the center electrode may have a symmetric structure in relation to the center electrode, and be integrally fixed, the energy selection aperture may be fixed to the center electrode, the number of electrodes included in the first transfer lens and the number of electrodes included in the second transfer lens may be two, respectively, a rear portion electrode of the first transfer lens and a front portion electrode of the second transfer lens may configure an upper surface and a lower surface of a transfer lens support part including the entrance aperture and the monochromator therein, alignment electrodes correcting a position of the charged particle beam may be further arranged between the upper surface of the transfer lens support part and the entrance aperture, and between a rear electrode at the rear portion of the monochromator and the lower surface of the transfer lens support part, a first electrode voltage in the propagation direction of the charged particle beam of the first transfer lens may be the extraction voltage, a second electrode voltage in the propagation direction of the charged particle beam of the first transfer lens may be a pass-through voltage, a first electrode voltage in the propagation direction of the charged particle beam of the second transfer lens may be the pass-through voltage, a second electrode voltage in the propagation direction of the charged particle beam of the second transfer lens may be the extraction voltage.

The number of the plurality of electrodes disposed at the front portion and the number of the plurality of electrodes disposed at the rear portion of the center electrode may be two, respectively, the plurality of electrodes disposed at the front portion and the rear portion of the center electrode may have a symmetric structure in relation to the center electrode, and be integrally fixed, the energy selection aperture may be fixed to the center electrode, the number of electrodes included in the first transfer lens and the number of electrodes included in the second transfer lens may be three, respectively, a rear portion electrode of the first transfer lens and a front portion electrode of the second transfer lens may configure an upper surface and a lower surface of a transfer lens support part including the entrance aperture and the monochromator therein, alignment electrodes correcting a position of the charged particle beam may be further arranged between the upper surface of the transfer lens support part and the entrance aperture, and between a rear electrode at the rear portion of the monochromator and the lower surface of the transfer lens support part, a first electrode voltage in the propagation direction of the charged particle beam of the first transfer lens may be the extraction voltage, a second electrode voltage in the propagation direction of the charged particle beam of the first transfer lens may be a voltage maintaining the charged particle beam in parallel (collimated) trajectory, a third electrode voltage in the propagation direction of the charged particle beam of the first transfer lens may be a pass-through voltage lower than the extraction voltage, a first electrode voltage in the propagation direction of the charged particle beam of the second transfer lens may be a pass-through voltage, a second electrode voltage in the propagation direction of the charged particle beam of the second transfer lens may be the same voltage as the second electrode voltage of the first transfer lens, and a third electrode voltage in the propagation direction of the charged particle beam of the second transfer lens may be an extraction voltage higher than the pass-through voltage.

The charged particle beam apparatus may further include a charged particle beam acceleration tube between the counter electrode and the charged particle beam exit electrode.

A pass-through voltage $V_p$ may be applied to the center electrode, and an electrode arranged at a front side of the front portion and an electrode arranged at a rear side of the rear portion that are symmetric in relation to the center electrode, and a first cylindrical lens voltage $V_{CL1}$ may be applied to an electrode arranged at a rear side of the front portion that are symmetric in relation to the center electrode, and a second cylindrical lens voltage $V_{CL2}$ may be applied to an electrode arranged at a front side of the rear portion.

The first cylindrical lens voltage $V_{CL1}$ and the second cylindrical lens voltage $V_{CL2}$ may have the same level.

Position of the electrodes integrally fixed to each other may be adjusted by the position adjustment part in relation to a central axis of the second transfer lens part.

A lower electrode of the second transfer lens part and the counter electrode may be applied with the same potential.

A lower electrode of the first transfer lens part and an electrode disposed at a front side of the front portion that are symmetric in relation to the center electrode may be applied with the same potential.

An upper electrode of the second transfer lens part and an electrode disposed at a rear side of the rear portion may be applied with the same potential The charged particle beam exit electrode may be a part of a condenser lens of the optical system where the charged particle beam passing through the exit electrode propagates.

The charged particle beam exit electrode may be a part of an acceleration tube where the charged particle beam passing through the exit electrode is accelerated.

The transfer lens support part may be positioned in a space where a vacuum state is maintained with an evacuation pipe, and may have the same potential as a lower electrode of the first transfer lens part and an upper electrode of the second transfer lens part.

The position adjustment part may be provided while passing through the transfer lens (axially symmetric lens) support part.

The position adjustment part may be connected to the center electrode to act.

A charged particle of the charged particle beam may be an electron, and the charged particle beam exit electrode may be an anode.

The charged particle source of the charged particle that is an electron, the suppressor, and the extractor may be connected to an electron gun flange that is ground potential through an insulation material, the ground part may be connected to bellows so that adjustment in a horizontal direction and a vertical direction in vacuum is performed, such that an electron source may be replaced independently from the monochromator.

A charged particle of the charged particle beam may be an ion, and the charged particle beam exit electrode may be a cathode.

The charged particle beam apparatus may be a scanning electron microscope observing an image of a surface of the sample positioned in the sample chamber.

The charged particle beam apparatus may be a transmission electron microscope (TEM) obtaining an image of an electron beam transmitting the sample positioned in the sample chamber.

The charged particle beam apparatus may be an electron beam etching apparatus etching a surface of the sample positioned in the sample chamber.

The charged particle beam apparatus may be a focused ion beam apparatus processing a surface of the sample positioned in the sample chamber.

In another general aspect, there is provided an electron energy loss spectroscopy (EELS) using the monochromator described above.

In another general aspect, there is provided an electron energy loss spectroscopy (EELS) irradiating an electron beam transmitted through the monochromator described above to a sample positioned in a sample chamber, and dividing energy of the electron beam generated as a result of the irradiation by using the monochromator described above.

Advantageous Effects

In the monochromator according to the present invention, the integral structure in which the central electrode and the plurality of electrodes that are arranged at the front portion and the rear portion based on the central electrode are fixed to each other through insulator, is applied, therefore, a mechanism for adjusting an offset with respect to the optical axis is simplified as compared to the case of separately providing the lenses at the front portion and the rear portion, respectively, and a secondary aberration is canceled in the exit plane due to symmetry of the optical system.

EMBODIMENTS

Hereinafter, embodiments of the present invention will be described in detail as follows with reference to the accompanying drawings so that they can be easily practiced by those skilled in the art to which the present invention pertains. Before detailed description of the present invention, it is to be noted that terms or words used in the present specification and claims to be described below should not be construed as being limited to a general meaning or dictionary definition. Therefore, the configurations described in the embodiments and drawings of the present invention are merely most embodiments but do not represent all of the technical spirits of the present invention. Thus, it is to be understood that the present invention may include various equivalents thereto, and modifications thereof at the time of filing this application.

Figure 1:
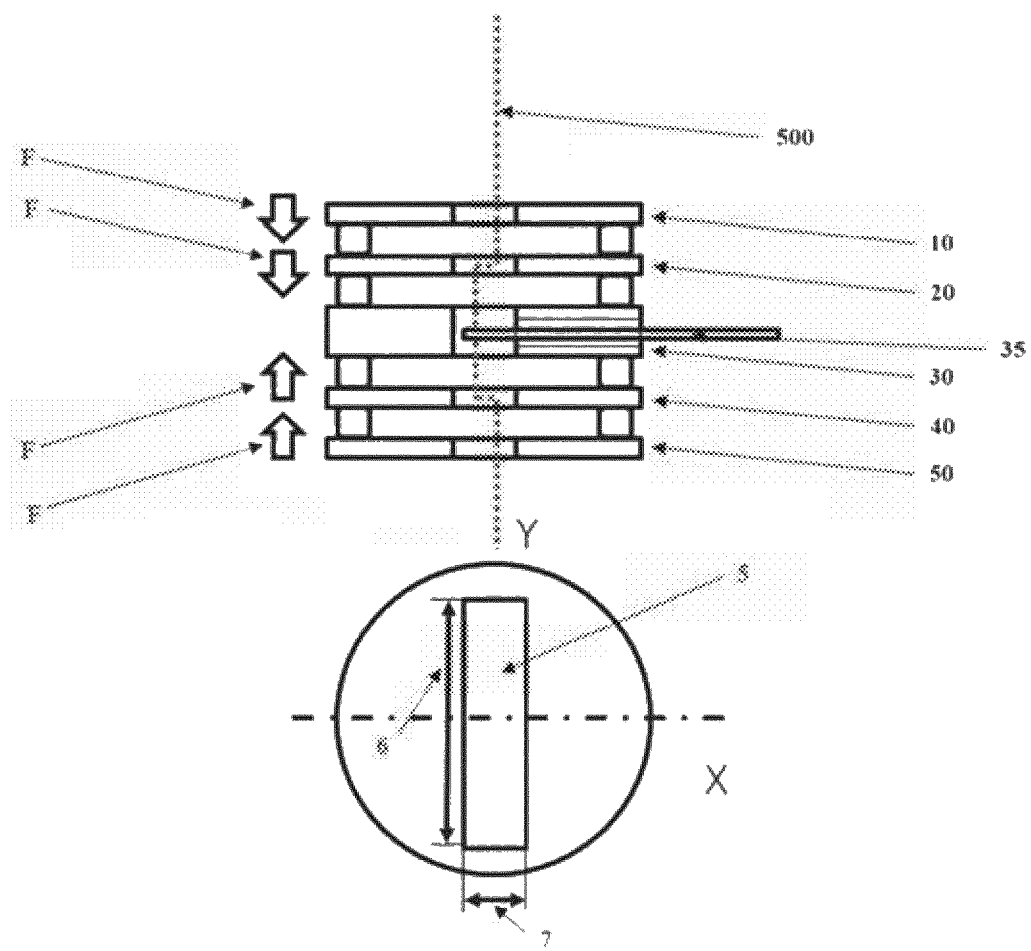
FIG. 1 is a conceptual diagram showing a monochromator having an integral structure and a cross section thereof according to an embodiment of the present invention.

FIG. 1 is a conceptual diagram showing a monochromator having an integral structure and a cross section thereof according to an embodiment of the present invention. The monochromator according to an embodiment of the present invention includes a center electrode 30 having a rectangular opening 5 and having an energy selection aperture 35 selectively passing a particle belonging to a predetermined energy range in a charged particle beam incident while having energy distribution therethrough at a center of a thickness in the rectangular opening; a plurality of electrodes each having a rectangular opening so that the incident charged particle beam may pass therethrough and each arranged in parallel at a front portion 10 and 20 and at a rear portion 40 and 50 in relation to the center electrode; a control power source part (not shown) applying power so that the openings of the plurality of electrodes each arranged at the front portion and the rear portion function as an electrostatic lens; and a position adjustment part 70 adjusting position of the center electrode and the plurality of electrodes so that a center in a short-side 7 direction of the rectangular opening is moved by a predetermined distance from a central axis of the incident charged particle beam, to allow the plurality of electrodes arranged at the front portion to function as the electrostatic lens to deflect the incident charged particle beam in one direction and to allow the plurality of electrodes arranged at the rear portion to function as the electrostatic lens to deflect again the charged particle beam that is deflected in one direction to an original position to emit the charged particle beam. A propagation direction of the charged particle beam is defined as a Z-direction, the short-side 7 direction of the opening is defined as an X-direction, and a long-side 6 direction is defined as a Y-direction.

In an embodiment of the present invention, the center electrode and the plurality of electrodes have an integral structure in which the center electrode and the plurality of electrodes are fixed to each other through insulator. The insulator is implemented by an inter-monochromator electrode insulation part 60. Further, the plurality of electrodes each disposed at the front portion and the rear portion of the center electrode are two electrodes, respectively. The plurality of electrodes are integrally fixed to each other while forming a symmetric structure in relation to the center electrode to decrease the number of electrodes as compared to the related art, thereby assembling so that central axes of the openings of the electrodes to precisely match each other and reducing costs. In an embodiment of the present invention, the electrodes at the front portion and the rear portion have a symmetric structure in relation to the center electrode, and the center electrode is thicker than the other four electrodes. Among the plurality of electrode, the two electrodes at the front portion are fixed (F) to the center electrode, and the two electrodes at the rear portion are also fixed (F) to the center electrode. The plurality of electrodes are assembled in a vertical direction to match to the center electrode, thus it is possible to perform precise assembling.

Figure 2:
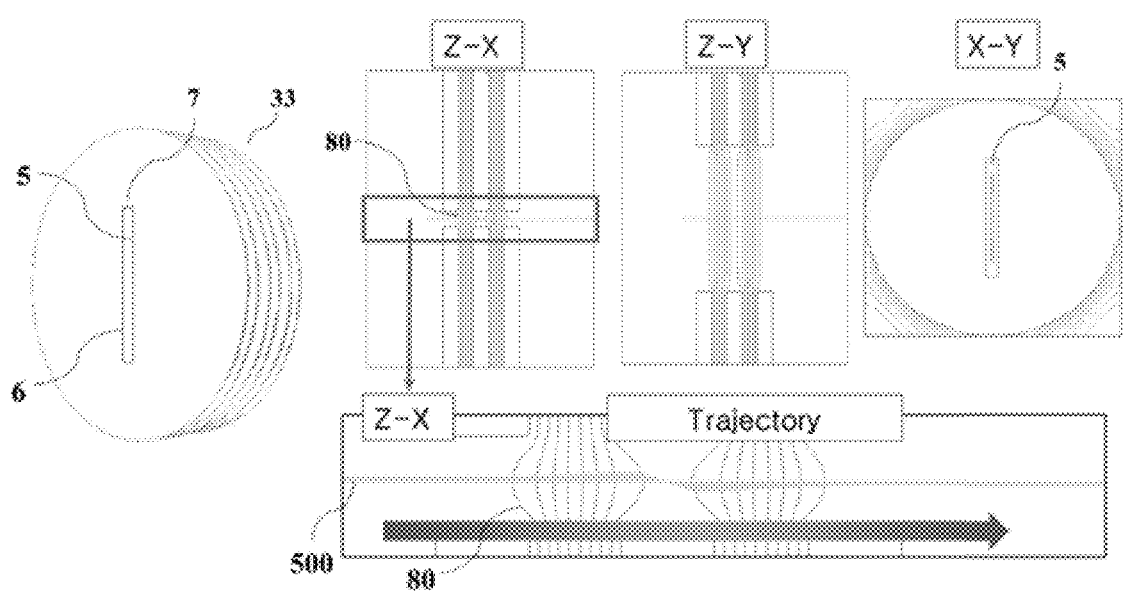
FIG. 2 is a conceptual diagram showing a principle that a potential of an opening of a cylindrical lens moves a trajectory of a charged particle beam according to an embodiment of the present invention.

FIG. 2 is a conceptual diagram showing a principle that a potential of an opening of a cylindrical lens moves a trajectory of a charged particle beam according to an embodiment of the present invention. In an embodiment of the present invention, a charged particle beam 500 is incident to a position offset from the origin of an X-axis that is a short side 7 by (+)Xd and of which a value of a Y-axis that is a long side 6 is zero. That is, the charged particle beam incident to the front portion electrodes 10 and 20 is incident while being deflected, to a position out of the center of a potential 80 formed by the opening, thereby being applied with a deflection force. A trajectory of the charged particle beam applied with the deflection force is deviated from a centrosymmetric position, and is deflected in an opposite direction at the rear portion electrodes 40 and 50 to return to an extension of the original incident trajectory. At this point, since the charged particle beam is offset along the X-axis which is the short-side 7 direction of the opening, the trajectory is not changed along the Y-axis which is the long-side 6 direction but is changed along the X-axis, and the charged particle beam is propagated while being divided for each energy, and the charged particle beam 500 of the mean energy is selectively passed through the energy selection aperture 35 provided at the center electrode 30.

Figure 3:
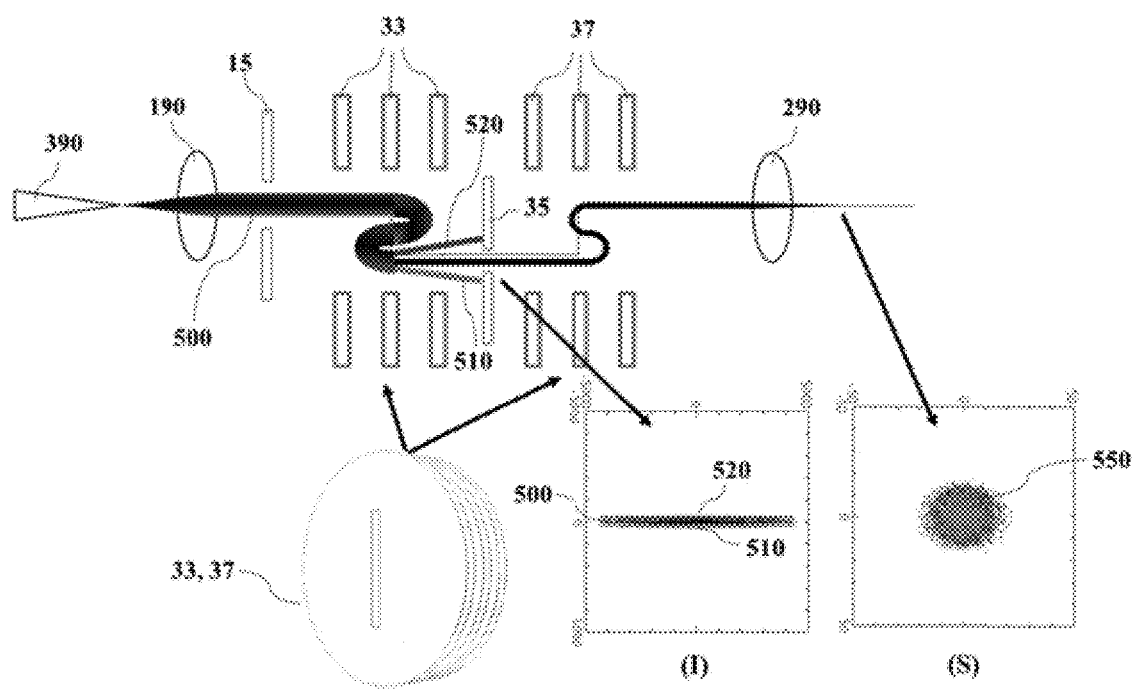
FIG. 3 is a conceptual diagram for charged particle beam energy selection of the monochromator.

FIG. 3 is a conceptual diagram for charged particle beam energy selection of the monochromator, and illustrates with emphasis the trajectory change of the charged particle beam in the monochromator configured of three electrodes arranged at the front portion of the center electrode and three electrodes arranged at the rear portion of the center electrode so that the trajectory change is exaggerated. The actual charged particle beam moves so that the path thereof is in parallel to the propagation direction of the charged particle beam at the time of propagation, but in order to described the movement of the charged particle beam, it is illustrated in the drawing as if the charged particle beam is curved while making a detour. The charged particle beam 500 emitted from a charged particle source 390 is incident to a front portion cylindrical lens 33 via a first transfer lens 190 and an entrance aperture 15, and the trajectory is changed by the cylindrical lens 33 and divided into charged particle beams 510 and 520 of which energy is dispersed. When viewed from the propagation direction, a form of the trajectory-divided charged particle beams 510 and 520 of which energy is dispersed and the center charged particle beam is as Graph I. The propagation path of the charged particle beams 510 and 520 of which energy is dispersed is shielded by the energy selection aperture 35, and only the charged particle beam 500 positioned at the central portion passes and returns to the original trajectory at a rear portion cylindrical lens 37 to propagate. When viewed from the propagation direction, a form of the charged particle beam returned to the original trajectory to propagate after passing through a second transfer lens 290 is observed (S) as a circular shape. In an embodiment of the present invention, the cylindrical lens may be configured of two electrodes.

Figure 4:
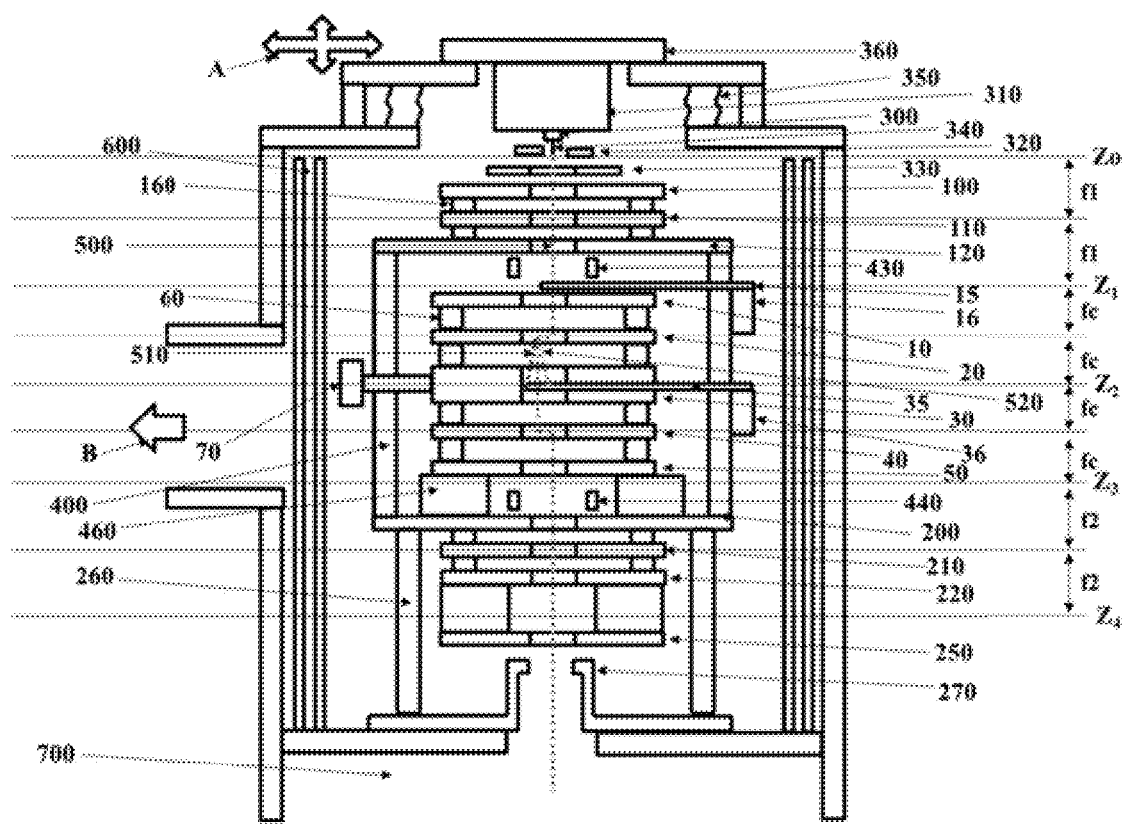
FIG. 4 is a conceptual diagram showing a charged particle beam apparatus in which the monochromator offset in a short-side direction of a rectangular opening with respect to an optical axis of the charged particle beam, according to an embodiment of the present invention.

FIG. 4 is a conceptual diagram showing a charged particle beam apparatus in which the monochromator offset in a short-side direction of a rectangular opening with respect to an optical axis of the charged particle beam, according to an embodiment of the present invention, and illustrates the charged particle beam apparatus including a monochromator with an integral structure configured of a plurality of electrodes of which centers of the rectangular openings match to each other. The charged particle beam apparatus including a monochromator according to an embodiment of the present invention includes a charged particle source 340 emitting a charged particle beam; a filament 300 applying a current $I_{fil}$ heating the charged particle source; a suppressor 320 suppressing electronic radiation in an arbitrary direction from the charged particle source; an extractor 330 applying an extraction voltage $V_{ext}$ to the charged particle source; first transfer lens (first axially symmetric lens) parts 100, 110, and 120 focusing and passing the charged particle beam passing through the extractor and including a plurality of electrodes each having an opening; an entrance aperture 15 spaced apart from the first transfer lens parts in a propagation direction of the charged particle beam and limiting an incident angle of the charged particle beam passing through the first transfer lens to be in a predetermined range; a monochromator selectively passing a charged particle beam of a predetermined energy range in the charged particle beam passing through the incident aperture; second transfer lens (second axially symmetric lens) parts 200, 210, and 220 focusing and passing the charged particle beam passing through the monochromator and including a plurality of electrodes each having an opening; a charged particle beam exit electrode 270 emitting the charged particle beam passing through the second transfer lens and grounded; an optical system 700 having a charged particle beam lenses, deflection systems, and astigmatism correction apparatuses at a rear of the monochromator; a sample onto which the charged particle beam is irradiated and a sample chamber having the sample mounted therein; a detector detecting the charged particle beam emitted from the sample through irradiation of the charged particle beam; and a controller. In an embodiment of the present invention, the charged particle source 340 and the filament 300 are connected to a vacuum-sealed flange 360 as a ground part and a part of a vacuum chamber through an insulator 310, and may be aligned and protected using bellows 350. Further, the entrance aperture 15 is adjusted by an entrance aperture adjustment part 16, and a monochromator position adjustment part 70 and an energy selection aperture 35 of the monochromator are also adjusted by the energy selection aperture adjustment part 36. The alignment and adjustment (A) are performed in an X direction and a Y direction, respectively. The monochromator position adjustment part 70 may be operated based on a transfer lens support part 400 maintaining an interval between the transfer lenses positioned at the front and rear portions and connecting the transfer lenses through insulator. In an embodiment of the present invention, the transfer lenses 100 to 120 and 200 to 220 are insulated and connected through a transfer lens insulation part 160.

The charged particle source, the suppressor, the extractor, the first transfer lens part, the incident aperture, the monochromator, the second transfer lens, the optical system, the sample chamber, and the detector are maintained in a vacuum state through a vacuum pump (B), and protected from the an external magnetic field through a magnetic field shielding part 600. In an embodiment of the present invention, the vacuum pump is an ion pump. The monochromator according to an embodiment of the present invention includes a center electrode having a rectangular opening and having an energy selection aperture selectively passing a particle belonging to a predetermined energy range in a charged particle beam incident while having energy distribution therethrough at a center of a thickness in the rectangular opening; a plurality of electrodes each having a rectangular opening respectively so that the incident charged particle beam may pass therethrough and each arranged in parallel at a front portion and at a rear portion in relation to the center electrode; a power source part applying power so that the openings of the plurality of electrodes each arranged at the front portion and the rear portion function as an electrostatic lens; and a position adjustment part 70 adjusting position of the center electrode and the plurality of electrodes so that a center in a short-side 7 direction of the rectangular opening is offset by a predetermined distance from a central axis of the incident charged particle beam, to allow the plurality of electrodes arranged at the front portion to function as the electrostatic lens to deflect the incident charged particle beam in one direction and to allow the plurality of electrodes arranged at the rear portion to function as the electrostatic lens to deflect again the charged particle beam that is deflected in one direction to an original position to emit the charged particle beam, in which the central electrode and the plurality of electrodes have an integral structure in which they are fixed to each other through insulator.

A focal length of the first transfer lens is $f_1$, a frontal focal point is a light source position $Z_0$ and a back focal point coincides with a position $Z_1$ of the entrance aperture 15. A focal length of the second transfer lens is $f_2$, a frontal focal point is a position $Z_3$ passing through the monochromator and a back focal point coincides with a cross over position $Z_4$ where the charged particle beam is emitted. The plurality of electrodes each arranged in parallel to each other at the front portion (10 and 20), and at the rear portion (40 and 50), form cylindrical lenses 33 and 37, respectively, and the cylindrical lens has a focal length of fc using a secondary focusing condition. Centers of the two cylindrical lenses 33 and 37 are symmetric in relation to a position of the energy selection aperture 35 that is a centrosymmetric position $Z_2$, and are positioned to be spaced apart from the centrosymmetric position $Z_2$ by the focal length fc, respectively. That is, a frontal focal point of the front part cylindrical lens 33 is positioned at a front portion from the center of the front part cylindrical lens 33 by fc, and a back focal point of the rear part cylindrical lens 37 is positioned at a rear portion from the center of the rear part cylindrical lens 37 by fc.

The charged particle beam apparatus including a monochromator according to an embodiment of the present invention may further include a counter electrode 250 spaced apart from the second transfer lens part in the propagation direction of the charged particle beam and facing the second transfer lens part between the second transfer lens and the charged particle beam exit electrode. The counter electrode 250 encloses below the cross over $Z_4$ of the charged particle beam emission position, thus the same potential as that of a lower electrode 220 of the second transfer lens is applied, and an electrode having different potential is disposed therebelow. In the case in which the counter electrode is not installed and the electrode having different potential is disposed, the position $Z_4$ of the cross over is changed depending on a voltage of the electrode having different potential. Accordingly, more complicated optical calculation of the monochromator than usual is required according to criteria of the voltage. In the case of installing the counter electrode, since an electric field from the electrode having different potential is shielded, the position $Z_4$ of the cross over is not changed even when the voltage is changed. Therefore, conditions of use of an optical system of the rear end may be calculated independently from the monochromator, thus it is possible to easily set the conditions of use of the optical system.

Figure 5:
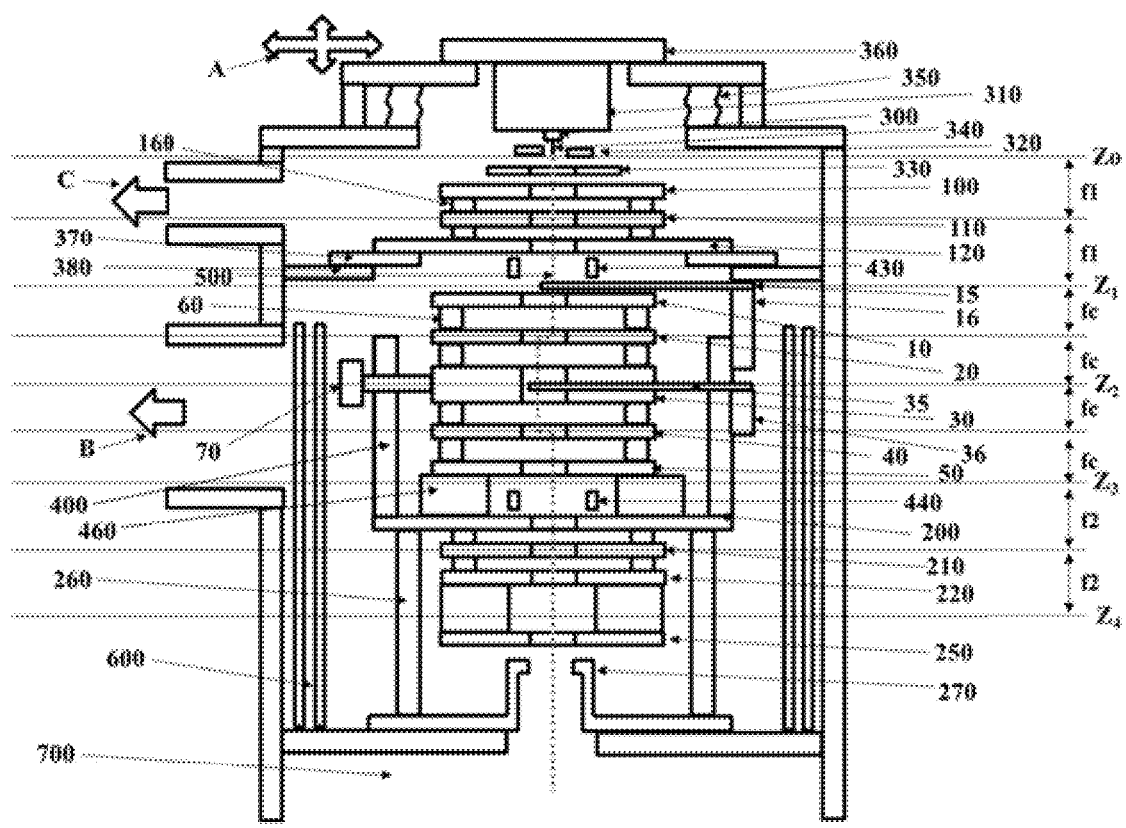
FIG. 5 is a conceptual diagram showing an apparatus having a vacuum region in which a charged particle source part and a monochromator part are separated according to an embodiment of the present invention.

FIG. 5 is a conceptual diagram showing a charged particle beam apparatus including a monochromator having a vacuum region in which a charged particle source part and a monochromator part are separated according to an embodiment of the present invention. In an embodiment of the present invention, the charged particle source 390, the suppressor 320, the extractor 330, and the first transfer lens part 190 are disposed in an ultrahigh vacuum chamber that is separated from the monochromator, and the separated ultrahigh vacuum space maintains an ultrahigh vacuum state through a separate vacuum pump (C). In an embodiment of the present invention, an inner wall 380 is installed in a vacuum chamber, the first transfer lens is connected to the wall of the chamber through an insulation part 370, and the vacuum pump evacuating the separated ultrahigh vacuum space is an ion pump.

In the charged particle beam apparatus including a monochromator according to an embodiment of the present invention, the number of the plurality of electrodes disposed at the front portion and the number of the plurality of electrodes disposed at the rear portion of the center electrode are two, respectively, the plurality of electrodes have a symmetric structure in relation to the center electrode, and are integrally fixed, the energy selection aperture is fixed to the center electrode, the number of electrodes included in the first transfer lens and the number of electrodes included in the second transfer lens are three, respectively, a rear portion electrode of the first transfer lens and a front portion electrode of the second transfer lens configure an upper surface and a lower surface of the transfer lens support part including the entrance aperture and the monochromator therein, alignment electrodes correcting a position of the charged particle beam are further arranged between the upper surface of the transfer lens support part and the entrance aperture 430, and between a rear electrode at the rear portion of the monochromator and the lower surface of the transfer lens support part 440, a first electrode voltage in the propagation direction of the charged particle beam of the first transfer lens is the extraction voltage, a second electrode voltage in the propagation direction of the charged particle beam of the first transfer lens is a voltage maintaining the charged particle beam in parallel (collimated) trajectory, a third electrode voltage is a pass-through voltage lower than the extraction voltage, a first electrode voltage in the propagation direction of the charged particle beam of the second transfer lens is a pass-through voltage, a second electrode voltage in the propagation direction of the charged particle beam of the second transfer lens is the same voltage as the second electrode voltage of the first transfer lens, and a third electrode voltage is an extraction voltage higher than a pass-through voltage. The first transfer lens voltage is determined by the optical calculation. An beam trajectory that the charged particle beam emitted from one point at this voltage is parallel. Any voltage may be designated as a pass-through voltage. As described above, preferably, a pass-through voltage lower than the extraction voltage is applied. The second transfer lens voltage is almost the same as the first transfer lens voltage, but a position of the focal point is changed due to a dimensional error of the lens system. However, adjustment thereof is possible by changing the second transfer lens voltage. When the lens system is present at the rear end, the number of power source may be decreased by making the second transfer lens voltage to coincide with the first transfer lens voltage.

Figure 6:
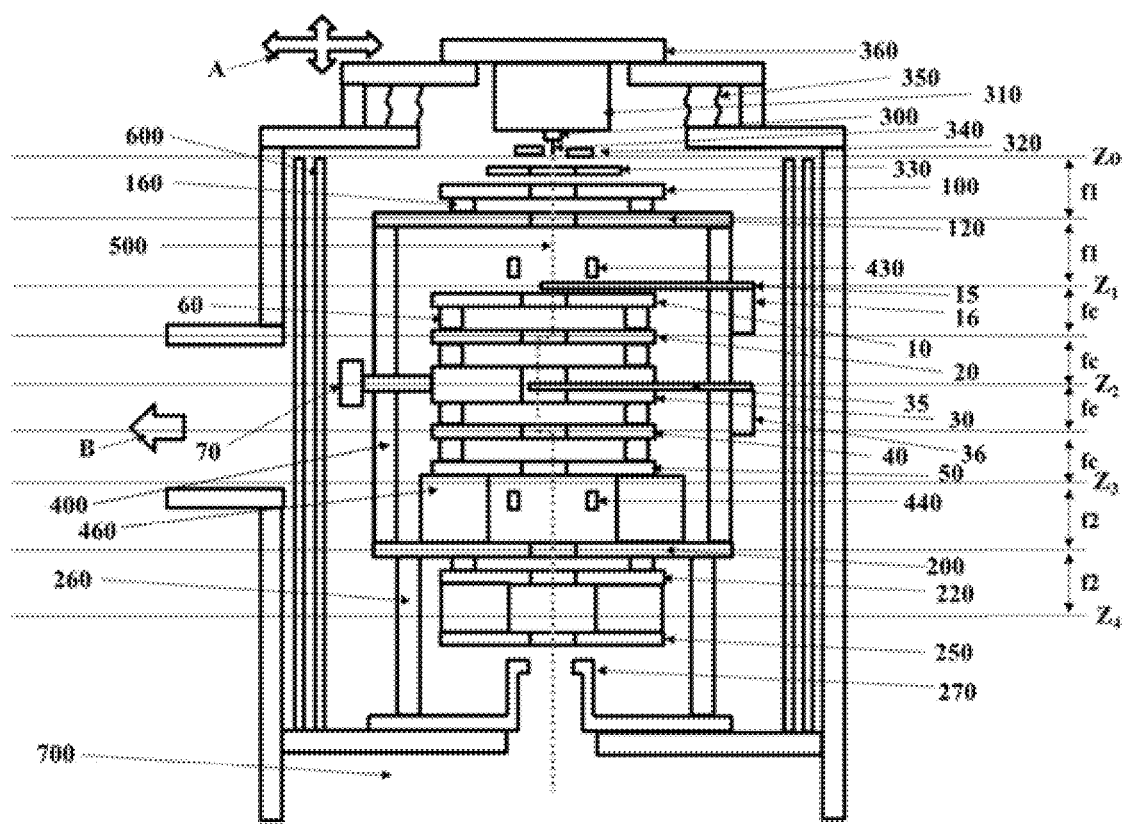
FIG. 6 is a conceptual diagram showing a charged particle beam apparatus including transfer lenses each having two electrodes according to an embodiment of the present invention.
Figure 7:
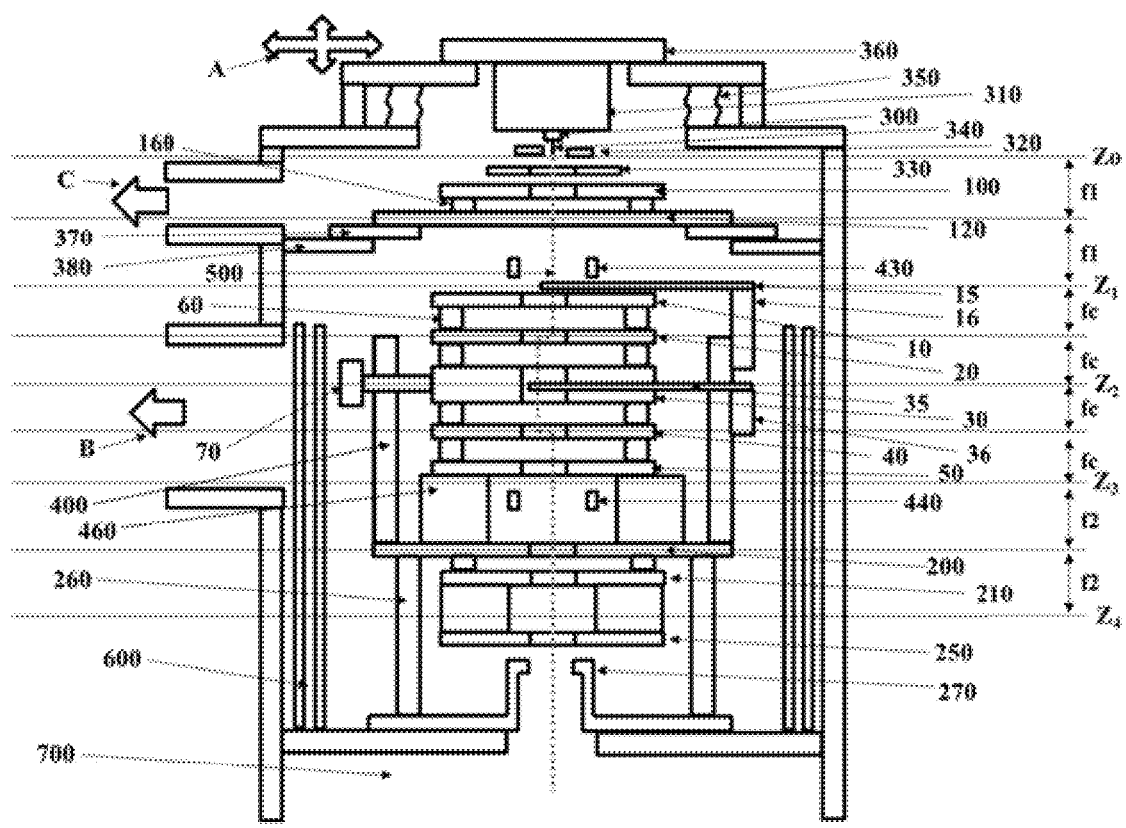
FIG. 7 is a conceptual diagram showing a charged particle beam apparatus including transfer lenses each having two electrodes at the same time while having a vacuum region in which a charged particle source part and a monochromator part are separated according to an embodiment of the present invention.

FIG. 6 is a conceptual diagram showing a charged particle beam apparatus including transfer lenses each having two electrodes according to an embodiment of the present invention, and FIG. 7 is a conceptual diagram showing a charged particle beam apparatus including transfer lenses each having two electrodes at the same time while having a vacuum region in which a charged particle source part and a monochromator part are separated according to an embodiment of the present invention. In the charged particle beam apparatus including a monochromator according to an embodiment of the present invention, the number of the plurality of electrodes disposed at the front portion and the number of the plurality of electrodes disposed at the rear portion of the center electrode are two, respectively, the plurality of electrodes have a symmetric structure in relation to the center electrode, and are integrally fixed, the energy selection aperture is fixed to the center electrode, the number of electrodes included in the first transfer lens and the number of electrodes included in the second transfer lens are two, respectively, the rear portion electrode of the first transfer lens and the front portion electrode of the second transfer lens configure an upper surface and a lower surface of the transfer lens support part including the entrance aperture and the monochromator therein, alignment electrodes correcting a position of the charged particle beam are further arranged between the upper surface of the transfer lens support part and the entrance aperture 430, and between a rear electrode at the rear portion of the monochromator and the lower surface of the transfer lens support part 440, a first electrode voltage in the propagation direction of the charged particle beam of the first transfer lens is the extraction voltage, a second electrode voltage in the propagation direction of the charged particle beam of the first transfer lens is a pass-through voltage, a first electrode voltage in the propagation direction of the charged particle beam of the second transfer lens is a pass-through voltage, a second electrode voltage in the propagation direction of the charged particle beam of the second transfer lens is the extraction voltage. The extraction voltage is determined according to a characteristic depending on a manufacturing process of the electron source, the pass-through voltage is determined by the optical calculation, and the trajectory of emitted charged particle beam is in parallel (collimated). In an embodiment of the present invention, the second electrode voltage is almost the same as the extraction voltage, but the position of the focal point due to the dimensional error of the lens system may be changed, which may be adjusted by changing the second electrode voltage. When the lens system is present at the rear end, the number of electrodes may be decreased by making the second electrode voltage to coincide with the extraction voltage.

Figure 8:
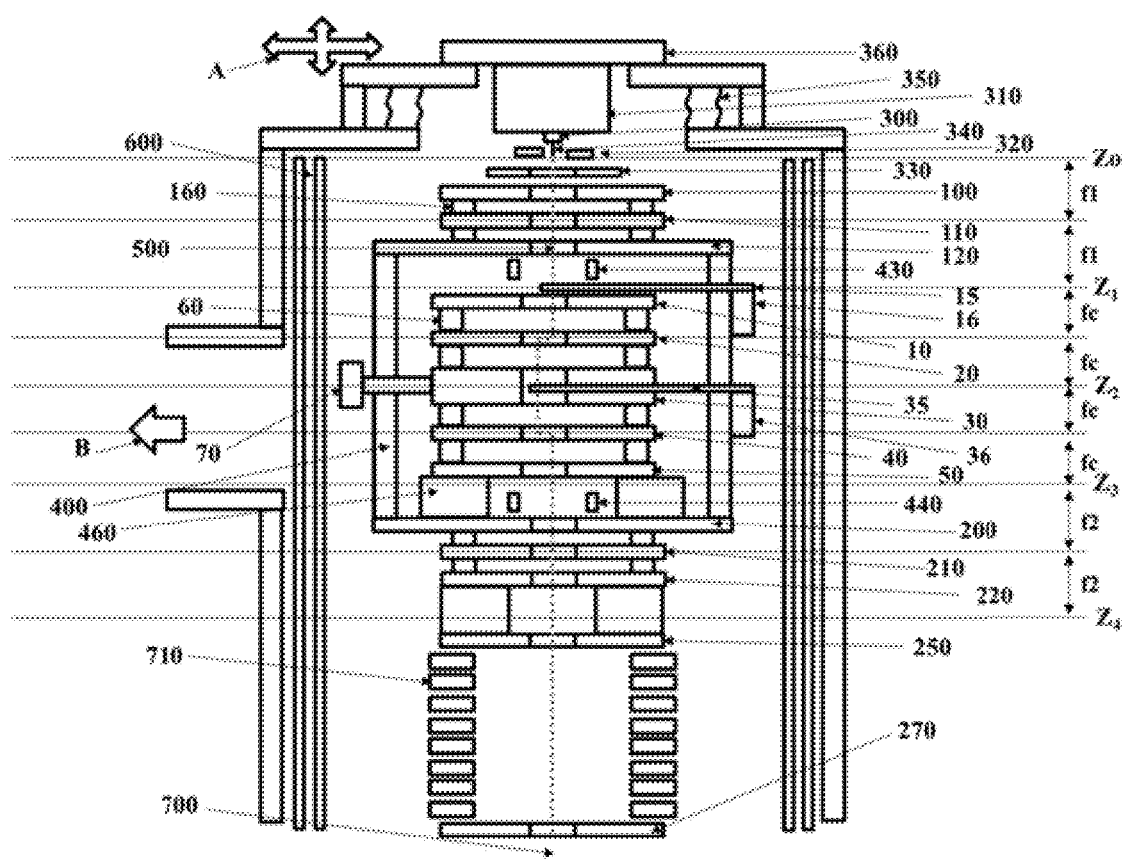
FIG. 8 is a conceptual diagram showing a charged particle beam apparatus having a charged particle beam acceleration tube according to an embodiment of the present invention.
Figure 9:
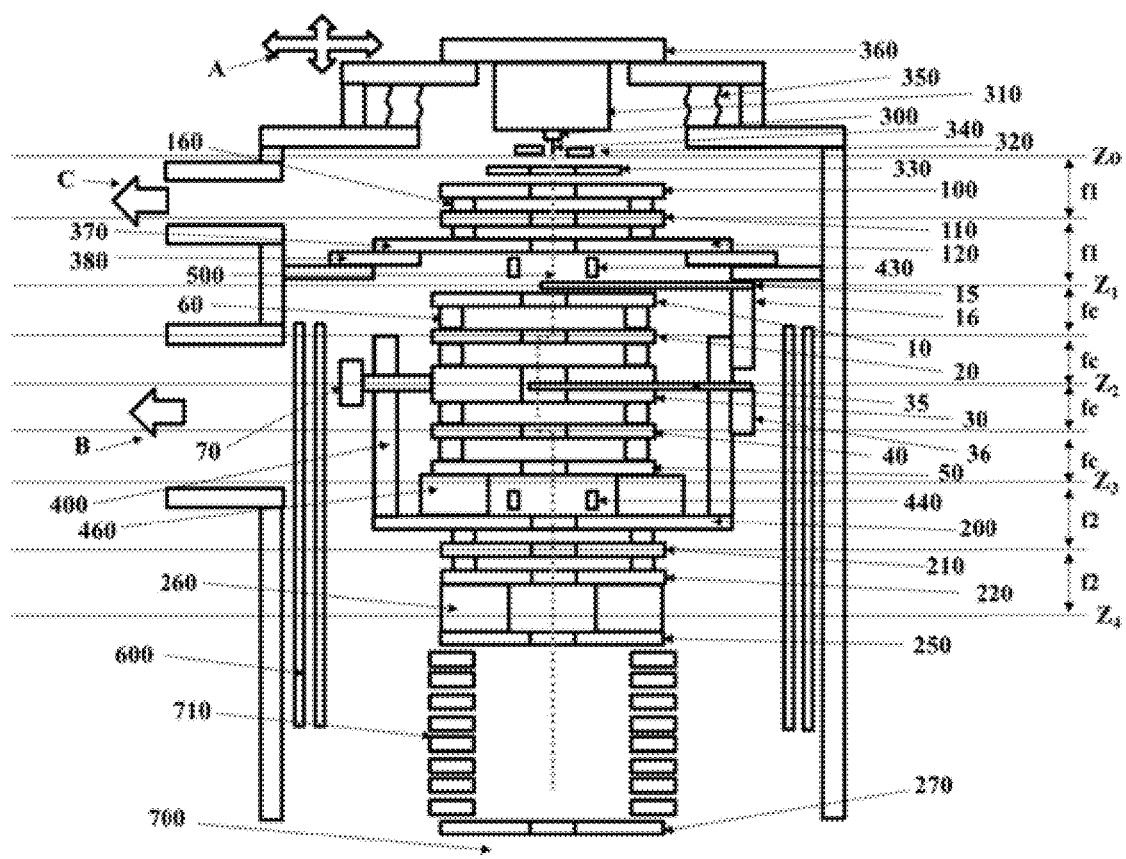
FIG. 9 is a conceptual diagram showing a charged particle beam apparatus having a charged particle beam acceleration tube at the same time while having a vacuum region in which a charged particle source part and a monochromator part are separated according to an embodiment of the present invention.

FIG. 8 is a conceptual diagram showing a charged particle beam apparatus having a charged particle beam acceleration tube according to an embodiment of the present invention, and FIG. 9 is a conceptual diagram showing a charged particle beam apparatus having a charged particle beam acceleration tube at the same time while having a vacuum region in which a charged particle source part and a monochromator part are separated according to an embodiment of the present invention. The charged particle beam apparatus including a monochromator according to an embodiment of the present invention further includes a charged particle beam acceleration tube 710 between the counter electrode 250 and the charged particle beam exit electrode 270. Since the position of the cross over is not changed even when energy of the charged particle beam is changed by installation of the acceleration tube, setting of conditions of the optical system at the rear end may be easily performed.

In an embodiment of the present invention, the charged particle beam apparatus including the monochromator applies a pass-through voltage $V_p$ to the center electrode, and an electrode arranged at a front side of the front portion and an electrode arranged at a rear side of the rear portion that are symmetric in relation to the center electrode, and a first cylindrical lens voltage $V_{CL1}$ is applied to an electrode arranged at the rear side of the front portion that are symmetric in relation to the center electrode, and a second cylindrical lens voltage $V_{CL2}$ is applied to an electrode arranged at the front side of the rear portion. Electrically, a symmetric structure in relation to the monochromator center electrode is formed, and the first cylindrical lens voltage and the second cylindrical lens voltage are ideally identical to each other, but adjustment thereof may be needed due to machining or assembly errors. In the above configuration, a secondary aberration is canceled in the exit plane due to symmetry of the optical system. In an embodiment of the present invention, the first cylindrical lens voltage $V_{CL1}$ and the second cylindrical lens voltage $V_{CL2}$ have the same level in the charged particle beam apparatus including the monochromator.

In an embodiment of the present invention, in the charged particle beam apparatus including the monochromator, position of the electrodes integrally fixed to each other may be adjusted by the position adjustment part 70 in relation to a central axis of the second transfer lens part 290. The above structure enables adjustment of the position of the central axis of the monochromator by an accurate amount of position with respect to the central axis of the second transfer lens part. Further, the above structure has an advantage that an integral structure is possible by adjusting position of the monochromator and the second transfer lens part. Relocation to the charged particle beam apparatus which is a main apparatus may also be easily performed after position adjustment under air pressure or position adjustment at another vacuum apparatus. By conducting performance evaluation of the monochromator, it is possible to perform an exchange in a monochromator unit when a failure occurs during a manufacturing process or during use. Further, it is also possible to minutely adjust position after generating the charged particle beam in the charged particle beam apparatus. In an embodiment of the present invention, as a driving part of the position adjustment mechanism, a motor and a piezoelectric device installed under vacuum may be used. The driving part may be operated by using a rotation motion feedthrough or a linear motion feedthrough outside the vacuum. A guide rail which is a movement mechanism may be installed to the transfer lens support part insulation part 460.

In an embodiment of the present invention, in the charged particle beam apparatus including the monochromator, the lower electrode of the second transfer lens part and the counter electrode are applied with the same potential. The counter electrode encloses below the cross over $Z_4$ of the charged particle beam emission position, thus the same potential as that of the lower electrode of the second transfer lens is applied. Further, another electrode is disposed therebelow. In the case in which the counter electrode is not installed and the electrode having different potential is disposed, the position $Z_4$ of the cross over is changed depending on a voltage of the electrode having different potential. Accordingly, more complicated optical calculation of the monochromator than usual is required according to criteria of the voltage. In the case of installing the counter electrode, since an electric field from the electrode having different potential is shielded, the position $Z_4$ of the cross over is not changed even when the voltage is changed. Therefore, conditions of use of an optical system of the rear end may be calculated independently from the monochromator, thus it is possible to easily set the conditions of use of the optical system.

In an embodiment of the present invention, in the charged particle beam apparatus including the monochromator, the lower electrode 120 of the first transfer lens part and the electrode disposed at the front side of the front portion that are symmetric in relation to the center electrode are applied with the same potential. As a result, the deflection action of the electron beam is cancelled when the monochromator is under operating conditions. Further, it is possible to install a first alignment electrode 430 and the entrance aperture 15 between the lower electrode 120 and the front electrode 10 at the front portion.

In an embodiment of the present invention, in the charged particle beam apparatus including the monochromator, an upper electrode 200 of the second transfer lens part and the electrode disposed at the rear side of the rear portion are applied with the same potential. As a result, the deflection action of the electron beam is cancelled when the monochromator is under operating conditions. Further, it is possible to install a second alignment electrode 440 between the upper electrode 200 and the rear electrode 50 at the rear portion.

In an embodiment of the present invention, in the charged particle beam apparatus including the monochromator, the charged particle beam exit electrode is a part of a condenser lens of the optical system where the charged particle beam passing through the exit electrode propagates. Since the position $Z_4$ of the cross over is not changed even when conditions of use of the condenser lens is changed, setting of conditions of the optical system at the rear end may be easily performed.

In an embodiment of the present invention, in the charged particle beam apparatus including the monochromator, the charged particle beam exit electrode is a part of an acceleration tube where the charged particle beam passing through the exit electrode is accelerated. In this case, since the position $Z_4$ of the cross over is not changed even when energy of the charged particle beam is changed, setting of conditions of the optical system at the rear end may be easily performed.

In an embodiment of the present invention, in the charged particle beam apparatus including the monochromator, the transfer lens support part 400 is positioned in a space where a vacuum state is maintained with an evacuation pipe, and maintains the same potential as the lower electrode 120 of the first transfer lens part and the upper electrode 200 of the second transfer lens part. The potential of the lower electrode 120 and the upper electrode 200 is the same as the pass-through voltage $V_P$, an insulation mechanism is not required, and the structure is simplified.

In an embodiment of the present invention, in the charged particle beam apparatus including the monochromator, the position adjustment part 70 is provided while passing through the transfer lens support part 400. With this, the first transfer lens, the two cylindrical lenses 33 and 37 of the monochromator, and the second transfer lens may be integrated. The relocation to the charged particle beam apparatus may be easily performed after position adjustment under atmosphere or position adjustment at another vacuum apparatus. By conducting performance evaluation of the monochromator, it is possible to perform an exchange in a monochromator unit when a failure occurs during a manufacturing process or onsite. As the driving part of the position adjustment mechanism, a motor and a piezoelectric device installed under vacuum may be used. Further, the driving part may be operated by using a rotation motion feedthrough or a linear motion feedthrough outside the vacuum.

In an embodiment of the present invention, in the charged particle beam apparatus including the monochromator, the position adjustment part is connected to the center electrode to act. The position adjustment part may act on the center of a height direction of the monochromator to decrease a slope when adjusting the position of the monochromator.

In an embodiment of the present invention, the charged particle of the charged particle beam apparatus including the monochromator is an electron, the charged particle beam exit electrode may be an anode. The source of the charged particle that is an electron, the suppressor, and the extractor are connected to an electron gun flange that is ground potential through an insulation material, the ground part is connected to the bellows so that adjustment in a horizontal direction and a vertical direction in vacuum is possible, thereby making it possible to replace the electron source independently from the monochromator. In an embodiment of the present invention, the charged particle of the charged particle beam apparatus including the monochromator is an ion, the charged particle beam exit electrode may be a cathode.

Figure 10:
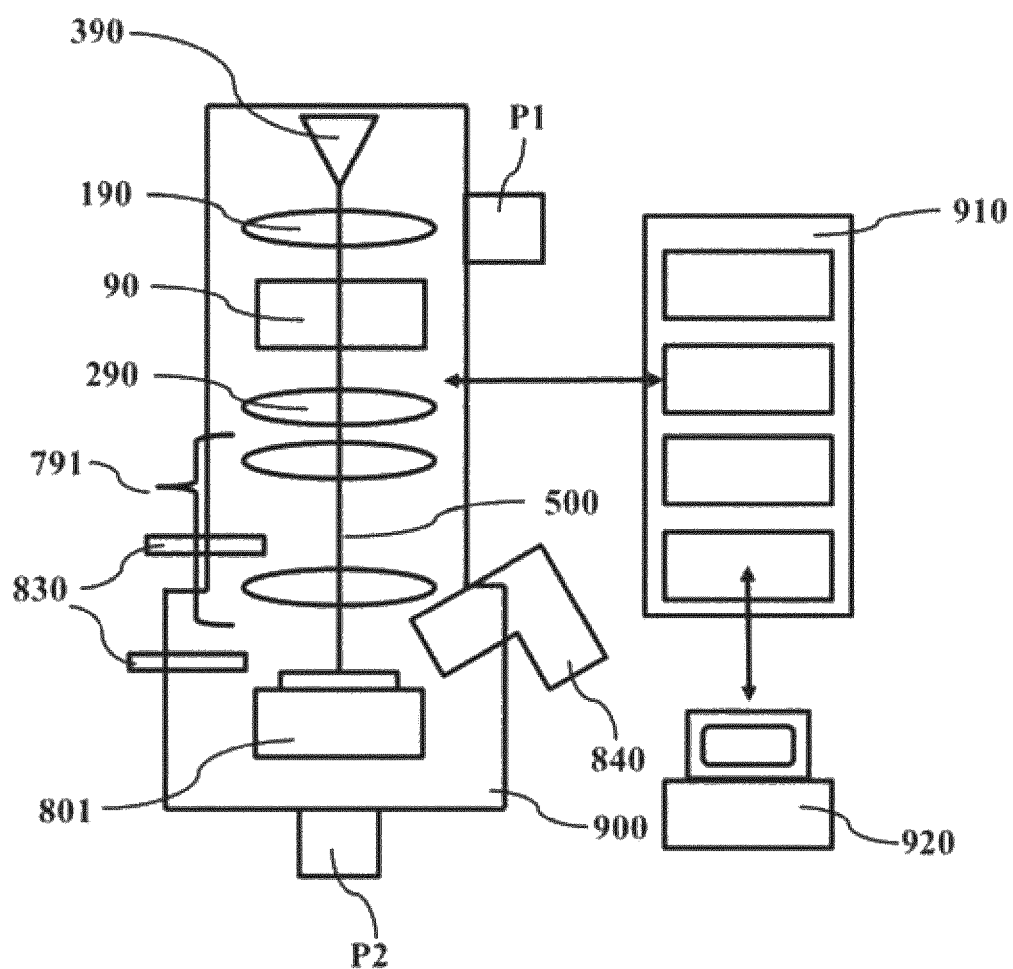
FIG. 10 is a conceptual diagram showing a scanning-type charged particle beam apparatus according to an embodiment of the present invention.
Figure 11:
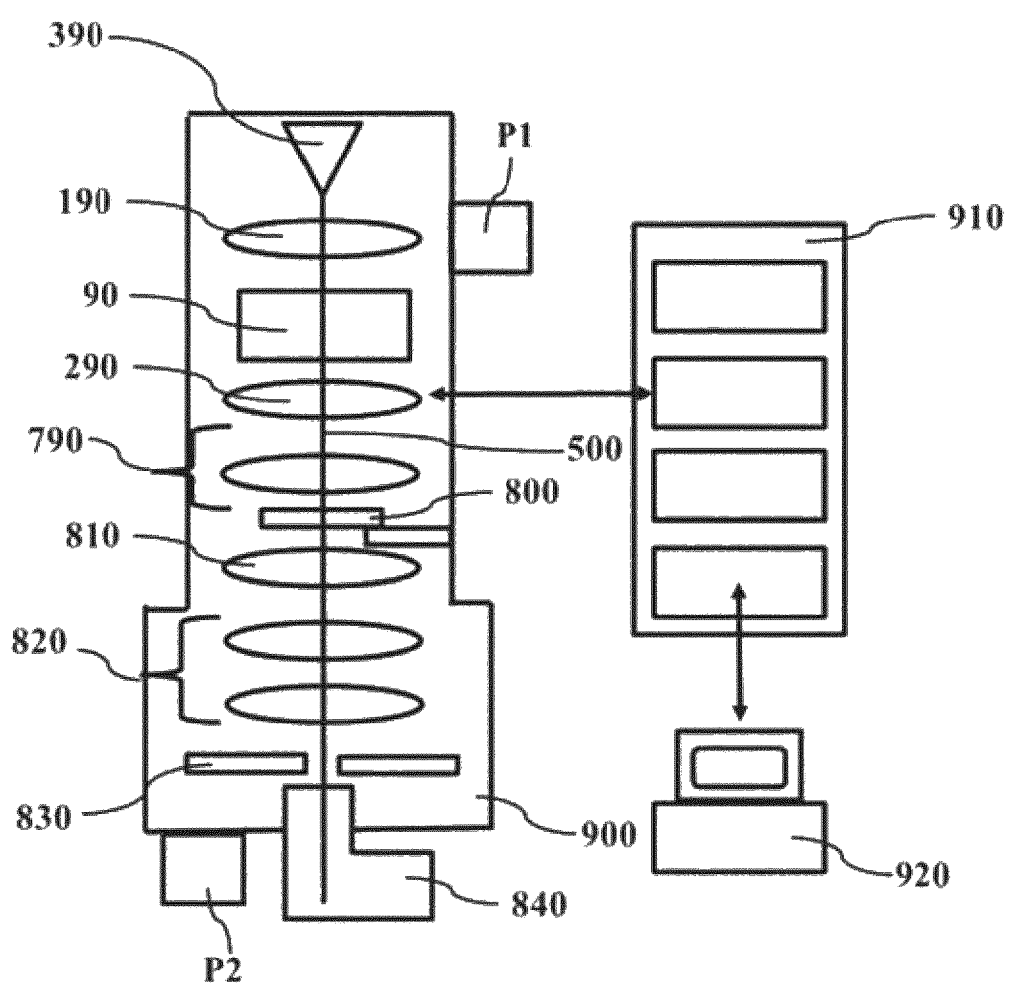
FIG. 11 is a conceptual diagram showing a transmission-type charged particle beam apparatus according to an embodiment of the present invention.

FIG. 10 is a conceptual diagram showing a scanning-type charged particle beam apparatus according to an embodiment of the present invention, and FIG. 11 is a conceptual diagram showing a transmission-type charged particle beam apparatus according to an embodiment of the present invention. A scanning-type alignment optical system 791 is used in the scanning-type charged particle beam apparatus, and a transmission-type alignment optical system 790 is used in the transmission-type charged particle beam apparatus. The charged particle beam apparatus may be a scanning electron microscope (SEM) for observing an image of a surface of a sample positioned in the sample chamber, or a transmission electron microscope (TEM) for obtaining an image of an electron beam transmitting the sample positioned in the sample chamber. In the case of the transmission electron microscope, a transmission-type sample holder 800, a transmission-type object lens 810, a transmission-type projection optical system 820, and a screen-detector 830 may be installed. In another configuration example of the present invention, the charged particle beam apparatus may be an electron beam etching apparatus etching a surface of a sample positioned in the sample chamber, or a focused ion beam apparatus processing a surface of a sample positioned in the sample chamber. Other optical system configuration may include the existing scanning electron microscope (SEM), focused ion beam apparatus (FIB, HIM), transmission electron microscope (TEM) and/or scanning transmission electron microscope (STEM). Optical elements such as a scanning apparatus scanning a beam, a stigmator of the beam, an alignment part correcting an optical axis of the beam and a position of a sample, a blanker shielding the beam in order to irradiate less beam to the sample, various detectors (a secondary electron detector or backscattered electron detector positioned in the lens, and a secondary electron detector in the sample chamber), etc. are disposed. In the transmission electron microscope (TEM, STEM), an illumination optics determining a current amount, an irradiation angle, and an illuminated area when irradiating an electron beam to the sample, and a projection optics enlarging an image of the sample and projecting the enlarged image to a screen, are disposed. Further, a plurality of transmission detectors detecting the transmitted electron beam are installed. The projection optics enables adjustment of a magnification, a visual field, conversion of a sample image and a diffraction image, a scattering angle, etc. A sample stage changing a position with respect to the sample and the beam (orthogonal coordinate), an angle (rotation, tilt), and a transfer system of the sample, etc. are also included. In addition, since the charged particle beam requires a vacuum environment, the charged particle beam is enclosed by a metal vacuum chamber, and the vacuum chamber is evacuated by ultrahigh vacuum pumps P1 and P2. In an embodiment of the present invention, a turbo pump is disposed in the sample chamber. In order to secure a good vacuum environment, various ion pumps may be disposed in a charged particle source chamber, and a middle chamber. Further, a gate valve for dividing into multiple chambers, a load lock chamber for replacing the sample, etc. may also be installed. In the charged particle optical apparatus having the above configuration, since energy spreading of the light source is narrow, contribution of the chromatic aberration is decreased, thereby improving resolving power.

In an embodiment of the present invention, an electron energy loss spectroscopy (EELS) using the monochromator is implemented, or an electron energy low spectroscopy (EELS) irradiating an electron beam transmitted through the monochromator to a sample positioned in the sample chamber, and dividing energy of the electron beam generated as a result of the irradiation by using the monochromator of claim 1 or 2, are implemented. The charged particle beam apparatus including the monochromator and observing a surface of a sample has a function of an electron energy loss spectroscopy (EELS) 840 dividing energy of the electron beam emitted from the surface of the sample, and may analyze and interpret a local composition of the sample, a chemical bonding state, an electron state, a dielectric function, and a phonon state by using the function. The charged particle beam apparatus including the monochromator and observing a sample by using an electron transmitted through the sample has a function of an electron energy loss spectroscopy (EELS) dividing energy of the transmitted electron beam, and may analyze and interpret a local composition of the sample, a chemical bonding state, an electron state, a dielectric function, and a phonon state by using the function. In the electron energy loss spectroscopy (EELS) using the monochromator of the present invention, since energy spreading of a primary beam is decreased, energy resolving power is improved.

Figure 12:
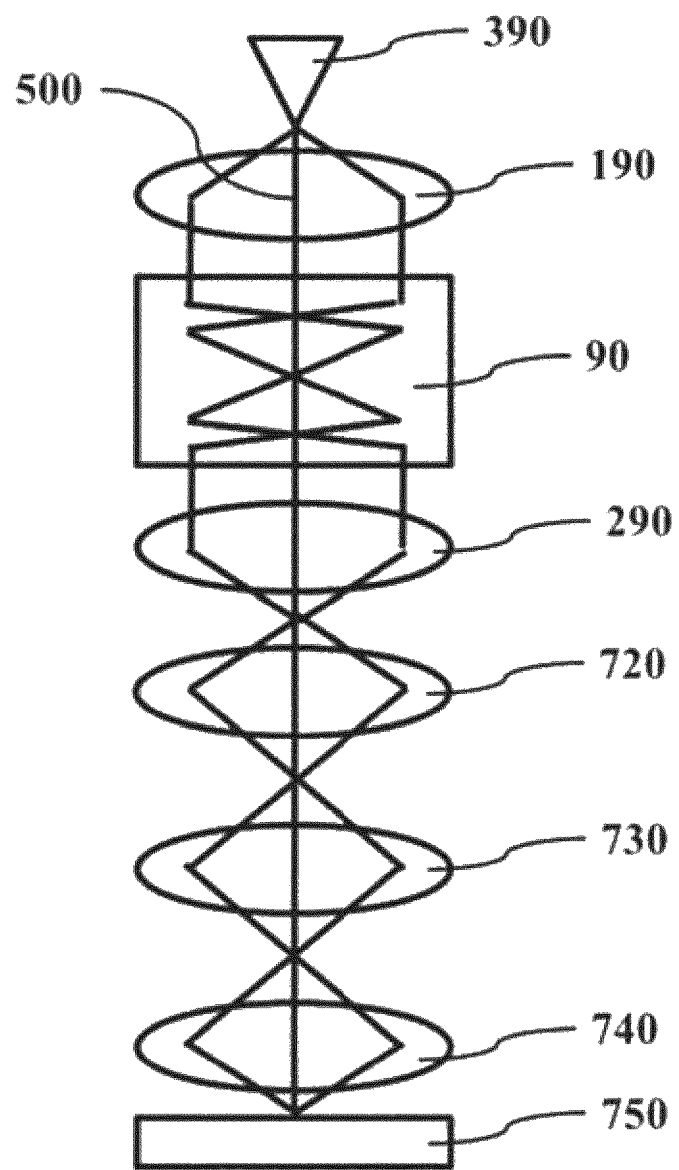
FIG. 12 is a conceptual diagram showing a scanning-type charged particle beam apparatus focusing a charged particle beam to a sample at an optimal open angle through a focusing lens and an object lens according to an embodiment of the present invention.

FIG. 12 is a conceptual diagram showing a scanning-type charged particle beam apparatus focusing a charged particle beam to a sample at an optimal open angle through a focusing lens and an object lens according to an embodiment of the present invention. In an embodiment of the present invention, the focusing lens is configured of a first focusing lens 720 and a second focusing lens 730. The charged particle beam apparatus allows a focal point to be on a surface of a sample 750 of an object lens 740 through the lower monochromator lens in the cross over at the rear portion of the monochromator 90, and focuses the beam on the sample by the object lens. Excitation conditions of the first focusing lens 720 and the second focusing lens 730 may be adjusted to adjust an open angle without changing imaging conditions of the object lens. It is possible to perform optimal open angle adjustment in which a beam diameter determined by incident energy of the beam and aberration of the energy spreading optical system becomes minimum, through the monochromator and/or the object lens.

Figure 13:
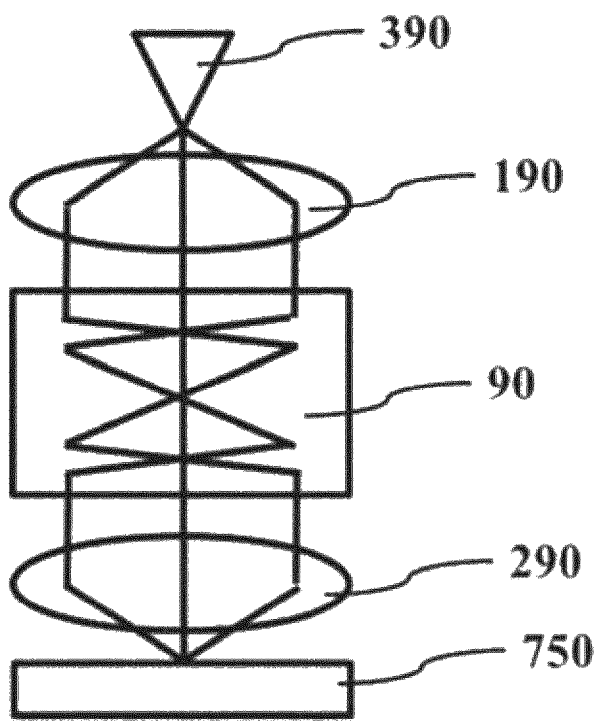
FIG. 13 is a conceptual diagram showing an optical system using upper and lower transfer lenses of the monochromator as a condenser lens, and an object lens according to an embodiment of the present invention.

FIG. 13 is a conceptual diagram showing a optical system using upper and lower transfer lenses of the monochromator as a condenser lens, and an object lens according to an embodiment of the present invention. The optical system uses the first transfer lens 190 and the second transfer lens 290 of the monochromator as a condenser lens and an object lens. Particularly, it is effective in the case of the scanning electron microscope (SEM) and the focused ion beam (FIB) using a low acceleration voltage. Since the optical system without a focusing point in a charged particle beam column may be implemented, an influence of a space charge effect may be decreased. Further, it is possible to increase rigidity and improve environmental performance by decreasing overall optical elements and a length of the apparatus. In this case, a ratio of focal lengths of the first transfer lens and the second transfer lens satisfies f2/f1=0.05 to 0.3, the light source is reduced to be used.

Figure 14:
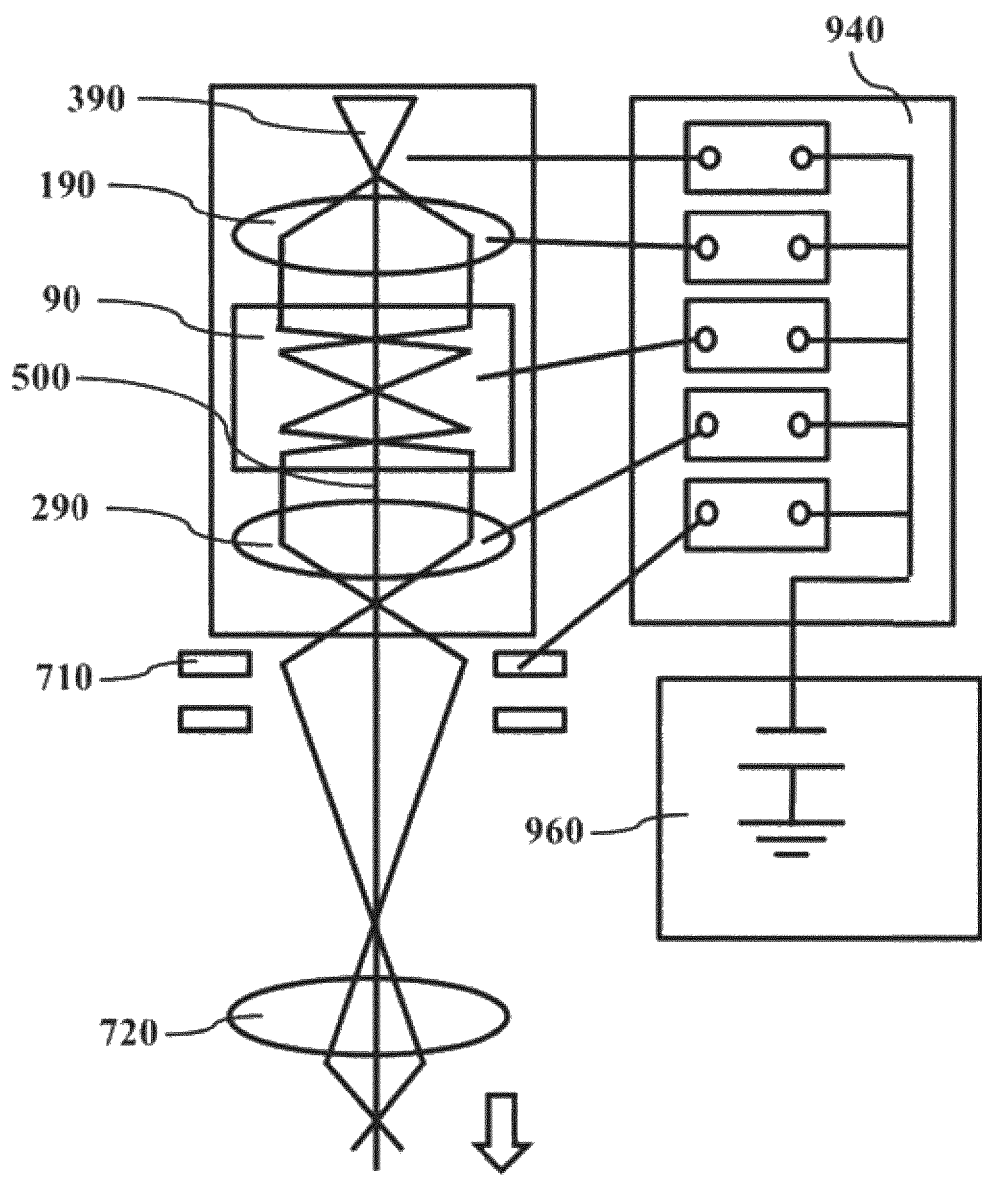
FIG. 14 is a conceptual diagram showing a charged particle beam apparatus in which a power source of the monochromator is overlapped with an acceleration voltage according to an embodiment of the present invention.

FIG. 14 is a conceptual diagram showing a charged particle beam apparatus in which a power source of the monochromator is overlapped with an acceleration voltage according to an embodiment of the present invention. In an embodiment of the present invention, the monochromator is installed in an electron gun high voltage part and used at the acceleration voltage, and an anode is disposed at the rear end thereof. The power source of the monochromator is overlapped with the acceleration voltage (ACC). In this case, charged particle energy of the monochromator 90 is 0.5 to 1 keV determined at a pass-through voltage $V_p$, and the acceleration voltage applied up to the anode of the rear end is accelerated to 0.5 to 60 keV. The energy $V_p$ of the monochromator does not depend on the acceleration voltage, thus setting conditions are constant, such that adjustment thereof is easy. Cylindrical lens voltages $V_{CL1}$ and $V_{CL2}$, an extraction voltage, transfer lens voltages $V_{TL1}$ and $V_{TL2}$, and a power source for adjusting a deflection voltage and a slit position of the alignment electrode need to be supplied while being overlapped with the acceleration voltage. It is mainly effective for the scanning electron microscopy (SEM) or transmission electron microscopy (TEM) used under a condition that the acceleration voltage is low (0.5 to 60 kV).

Figure 15:
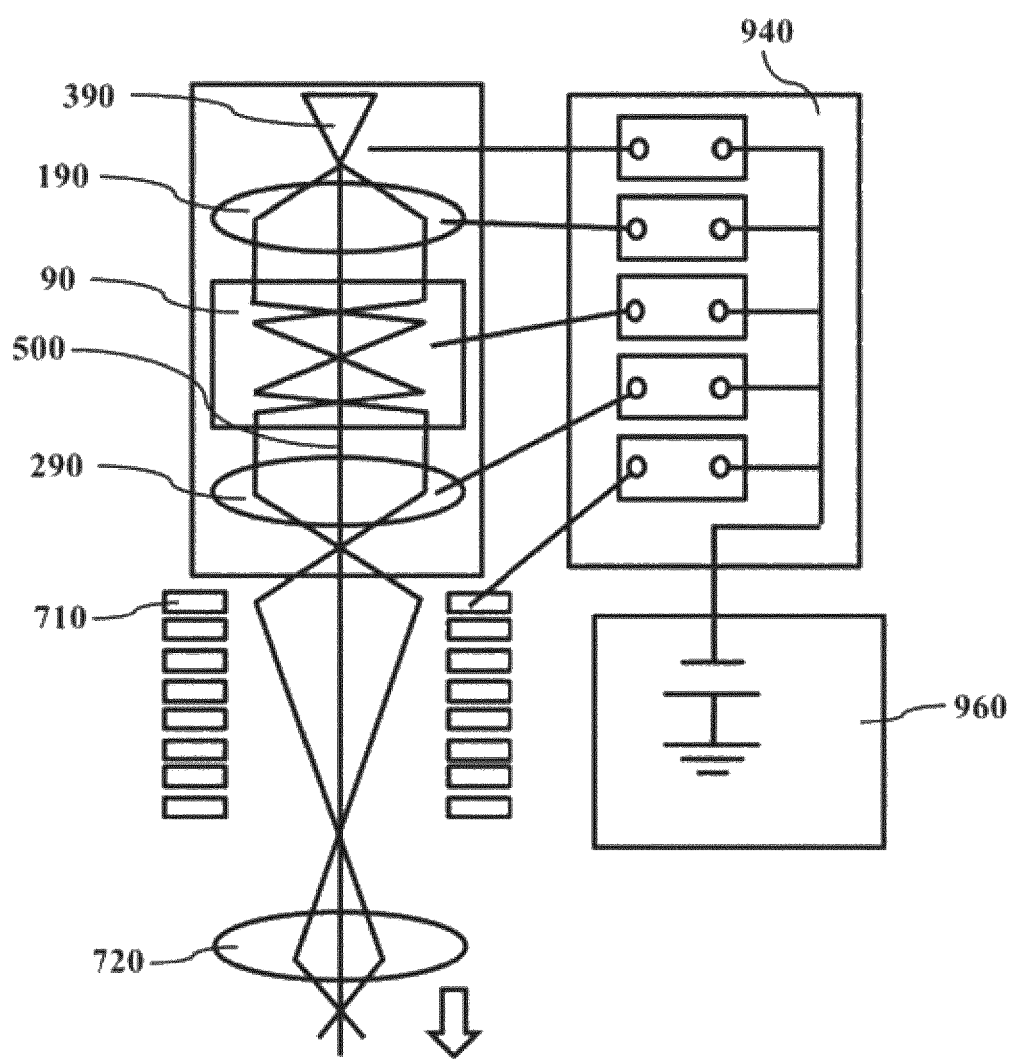
FIG. 15 is a conceptual diagram showing a charged particle beam apparatus in which the monochromator is installed at a charged particle source high voltage part and an acceleration tube is installed at a rear end of the monochromator according to an embodiment of the present invention.

FIG. 15 is a conceptual diagram showing a charged particle beam apparatus in which the monochromator is installed at a charged particle source high voltage part and an acceleration tube is installed at a rear end of the monochromator according to an embodiment of the present invention. In an embodiment of the present invention, the monochromator 90 is installed while being connected to an acceleration voltage circuit part 940 of the electron gun high voltage power source part 960, and used at the acceleration voltage. Further, the acceleration tube 710 is further installed at the rear end of the monochromator, and the power source of the monochromator is overlapped with the acceleration voltage. The acceleration voltage applied at the acceleration tube at the rear end of the monochromator is 100 to 300 kV. Particularly, it is effective for the transmission electron microscope (TEM) and the scanning transmission electron microscopy (STEM) with a high acceleration voltage. It is possible to use a transmission electron microscopy (TEM or STEM) with energy of 60 to 300 keV by disposing the acceleration tube at the rear end of the monochromator.

Figure 16:
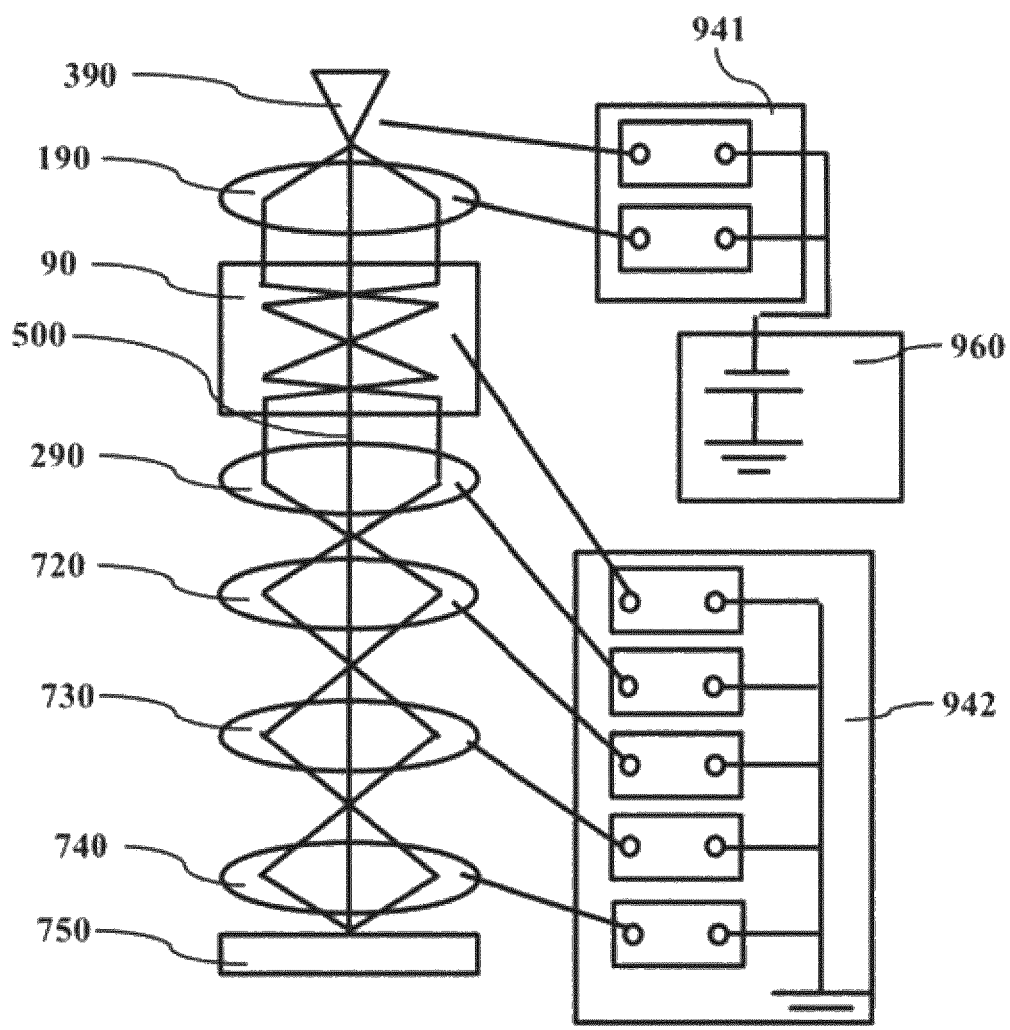
FIG. 16 is a conceptual diagram showing a charged particle beam apparatus using the monochromator based on a ground according to an embodiment of the present invention.

FIG. 16 is a conceptual diagram showing a charged particle beam apparatus using the monochromator based on a ground according to an embodiment of the present invention. In an embodiment of the present invention, in the charged particle beam apparatus using the monochromator 90 based on the ground, the monochromator 90 is installed while being connected to an electron source and first transfer lens acceleration voltage circuit part 941 and a monochromator, second transfer lens, and charged particle beam optical system acceleration voltage circuit part 942 of the electron gun high voltage power source part 960, and used at the acceleration voltage. When an interval of electrodes of the monochromator is 10 mm, about 60 kV of acceleration voltage may be applied to the center electrode, and up to 60 keV of acceleration voltage may be used. However, in the monochromator, since energy resolving power is inversely proportional to the acceleration voltage, performance of the monochromator is improved and a charged particle beam with narrow energy width may be obtained at a lower acceleration voltage. Since the power source for adjusting the deflection voltage and the slit position of the first alignment electrode and second alignment electrode is based on the ground, it is convenient to manufacture an electrometer. Meanwhile, since an output power source is required to be with high voltage in the cylindrical lens of the monochromator, a low noise power source with high stability is needed.

Hereinabove, although the embodiments of the present invention have been described in detail, the scope of the present invention is not limited thereto, but modifications and alterations made by those skilled in the art using the basic concept of the present invention defined in the following claims fall within the scope of the present invention.

All technical terms used in the present invention are used as a meaning generally understood by a person having ordinary knowledge in the art to which the present invention pertains, unless defined otherwise. Contents of all publications described in the present specification as reference documents are introduced into the present invention.

DETAILED DESCRIPTION OF MAIN ELEMENTS

5. Rectangular opening of cylindrical lens
6. Long side of rectangular opening
7. Short side of rectangular opening
10. Front electrode at front portion of monochromator
15. Entrance aperture
16. Entrance aperture adjustment part
20. Rear electrode at front portion of monochromator
30. Center electrode of monochromator
33, 37. Cylindrical lens
35. Energy selection aperture
36. Energy selection aperture adjustment part
40. Front electrode at rear portion of monochromator
50. Rear electrode at rear portion of monochromator
60. Insulation part between monochromator electrodes
70. Monochromator position adjustment part
80. Lens opening potential
90. Monochromator
100. Front portion electrode of first transfer lens
110. Center electrode of first transfer lens
120. Rear portion electrode of first transfer lens
160. Transfer lens insulation part
190. First transfer lens
191. First transfer lens-monochromator electrode
200. Front portion electrode of second transfer lens
210. Center electrode of second transfer lens
220. Rear portion electrode of second transfer lens
250. Counter electrode
260. Exit electrode insulation part
270. Exit electrode
290. Second transfer lens
291. Second transfer lens-monochromator electrode
300. Filament
310. Charged particle source insulation part
320. Suppressor
330. Extractor
340. Filament tip
350. Bellows
360. Flange
370. Charged particle source insulation part
380. Vacuum chamber wall
390. Charged particle source
400. Transfer lens support part
430. First alignment electrode
440. Second alignment electrode
460. Transfer lens support part insulation part
500. Charged particle beam
510, 520. Charged particle beam of which energy is dispersed
550. Circular focusing image of charged particle beam
600. Magnetic shielding part
700. Charged particle beam optical system
710. Acceleration tube
720. Charged particle beam first focusing lens
730. Charged particle beam second focusing lens
740. Charged particle beam object lens
750. Sample
790. Transmission-type alignment optical system
791. Scanning-type alignment optical system
800. Transmission-type sample holder
810. Transmission-type object lens
820. Transmission-type projection optical system
830. Screen/detector
840. Electron energy loss spectroscopy (EELS)
900. Vacuum chamber
910. Electronic circuit part
920. Controller
940. Acceleration voltage circuit part
941. Electron source and first transfer lens acceleration voltage circuit part
942. Monochromator, second transfer lens and charged particle beam optical system acceleration voltage circuit part
960. Power source part
A. Axis alignment (XY alignment)
B. Evacuation
C. Separated evacuation
F. Fixing direction of front portion electrode and rear portion electrode in relation to monochromator center electrode
P1, P2: Ultrahigh vacuum pump

The invention claimed is:

1. A charged particle beam apparatus including a monochromator, the charged particle beam apparatus comprising:
a charged particle source emitting a charged particle beam;
a filament applying a current $I_{fil}$ for heating the charged particle source;
a suppressor suppressing electronic radiation in an arbitrary direction from the charged particle source;
an extractor applying an extraction voltage $V_{ext}$ to the charged particle source;
first transfer lens parts focusing and passing the charged particle beam passing through the extractor and including a plurality of electrodes each having an opening;
an entrance aperture spaced apart from the first transfer lens parts in a propagation direction of the charged particle beam and limiting an incident angle of the charged particle beam passing through the first transfer lens to be in a predetermined range;
the monochromator selectively passing a charged particle beam of a predetermined energy range in the charged particle beam passing through the entrance aperture;
second transfer lens parts focusing and passing the charged particle beam passing through the monochromator and including a plurality of electrodes each having an opening;
a charged particle beam exit electrode emitting the charged particle beam passing through the second transfer lens and grounded;
an optical system having charged particle beam lenses and deflection systems at a rear of the monochromator;
a sample chamber configured to house a sample to which the charged particle beam is to be irradiated;
a detector detecting the charged particle beam emitted from the sample through irradiation of the charged particle beam; and
a controller,
wherein the charged particle source, the suppressor, the extractor, the first transfer lens part, the entrance aperture, the monochromator, the second transfer lens, the optical system, the sample chamber, and the detector are maintained in a vacuum state through a vacuum pump, and wherein the monochromator includes:
- a center electrode having a rectangular opening and having an energy selection aperture selectively passing a particle belonging to a predetermined energy range in a charged particle beam incident while having energy distribution therethrough at a center of a thickness in the rectangular opening;
- a plurality of electrodes each having a rectangular opening respectively so that the incident charged particle beam passes therethrough and each arranged in parallel at a front portion and at a rear portion in relation to the center electrode; and
- a power source part applying power so that the openings of the plurality of electrodes each arranged at the front portion and the rear portion function as an electrostatic lens,
- wherein the charged particle beam apparatus is configured to adjust positions of the center electrode and the plurality of electrodes so that a center in a short-side direction of the rectangular opening is offset by a predetermined distance from a central axis of the incident charged particle beam, to allow the plurality of electrodes arranged at the front portion to function as the electrostatic lens to deflect the incident charged particle beam in one direction and to allow the plurality of electrodes arranged at the rear portion to function as the electrostatic lens to deflect again the charged particle beam that is deflected in one direction to an original position to emit the charged particle beam, in which the central electrode and the plurality of electrodes have an integral structure in which they are fixed to each other through insulator.

2. The charged particle beam apparatus of claim 1, wherein the charged particle source, the suppressor, the extractor, and the first transfer lens part are disposed in an ultrahigh vacuum chamber that is separated from the monochromator, and the separated ultrahigh vacuum space maintains an ultrahigh vacuum state through a separate vacuum pump.

3. The charged particle beam apparatus of claim 1, further comprising a counter electrode spaced apart from the second transfer lens part in the propagation direction of the charged particle beam and facing the second transfer lens part between the second transfer lens and the charged particle beam exit electrode.

4. The charged particle beam apparatus of claim 1, wherein the number of the plurality of electrodes disposed at the front portion and the number of the plurality of electrodes disposed at the rear portion of the center electrode are two, respectively, the plurality of electrodes disposed at the front portion and the rear portion of the center electrode have a symmetric structure in relation to the center electrode, and are integrally fixed, the energy selection aperture is fixed to the center electrode, the number of electrodes included in the first transfer lens and the number of electrodes included in the second transfer lens are three, respectively, a rear portion electrode of the first transfer lens and a front portion electrode of the second transfer lens configure an upper surface and a lower surface of a transfer lens support part including the entrance aperture and the monochromator therein, alignment electrodes correcting a position of the charged particle beam are further arranged between the upper surface of the transfer lens support part and the entrance aperture, and between a rear electrode at the rear portion of the monochromator and the lower surface of the transfer lens support part, a first electrode voltage in the propagation direction of the charged particle beam of the first transfer lens is the extraction voltage, a second electrode voltage in the propagation direction of the charged particle beam of the first transfer lens is a voltage maintaining the charged particle beam in parallel trajectory, a third electrode voltage in the propagation direction of the charged particle beam of the first transfer lens is a pass-through voltage lower than the extraction voltage, a first electrode voltage in the propagation direction of the charged particle beam of the second transfer lens is a pass-through voltage, a second electrode voltage in the propagation direction of the charged particle beam of the second transfer lens is the same voltage as the second electrode voltage of the first transfer lens, and a third electrode voltage in the propagation direction of the charged particle beam of the second transfer lens is an extraction voltage higher than the pass-through voltage.

5. The charged particle beam apparatus of claim 1, further comprising: a charged particle beam acceleration tube between the counter electrode and the charged particle beam exit electrode.

6. The charged particle beam apparatus of claim 1, wherein a pass-through voltage $V_p$ is applied to the center electrode, and an electrode arranged at a front side of the front portion and an electrode arranged at a rear side of the rear portion that are symmetric in relation to the center electrode, and a first cylindrical lens voltage $V_{CL1}$ is applied to an electrode arranged at a rear side of the front portion that are symmetric in relation to the center electrode, and a second cylindrical lens voltage $V_{CL2}$ is applied to an electrode arranged at a front side of the rear portion.

7. The charged particle beam apparatus of claim 6, wherein, the first cylindrical lens voltage $V_{CL1}$ and the second cylindrical lens voltage $V_{CL2}$ have the same level.

8. The charged particle beam apparatus of claim 1, wherein position of the electrodes integrally fixed to each other is adjusted in relation to a central axis of the second transfer lens part.

9. The charged particle beam apparatus of claim 1, wherein a lower electrode of the second transfer lens part and the counter electrode are applied with the same potential.

10. The charged particle beam apparatus of claim 1, wherein a lower electrode of the first transfer lens part and an electrode disposed at a front side of the front portion that are symmetric in relation to the center electrode are applied with the same potential.

11. The charged particle beam apparatus of claim 1, wherein an upper electrode of the second transfer lens part and an electrode disposed at a rear side of the rear portion are applied with the same potential.

12. The charged particle beam apparatus of claim 1, wherein the charged particle beam exit electrode is a part of a condenser lens of the optical system where the charged particle beam passing through the exit electrode propagates.

13. The charged particle beam apparatus of claim 1, wherein the charged particle beam exit electrode is a part of an acceleration tube where the charged particle beam passing through the exit electrode is accelerated.

14. The charged particle beam apparatus of claim 1, wherein the number of the plurality of electrodes disposed at the front portion and the number of the plurality of electrodes disposed at the rear portion of the center electrode are two, respectively, the plurality of electrodes disposed at the front portion and the rear portion of the center electrode have a symmetric structure in relation to the center electrode, and are integrally fixed, the energy selection aperture is fixed to the center electrode, the number of electrodes included in the first transfer lens and the number of electrodes included in the second transfer lens are two, respectively, a rear portion electrode of the first transfer lens and a front portion electrode of the second transfer lens configure an upper surface and a lower surface of a transfer lens support part including the entrance aperture and the monochromator therein, alignment electrodes correcting a position of the charged particle beam are further arranged between the upper surface of the transfer lens support part and the entrance aperture, and between a rear electrode at the rear portion of the monochromator and the lower surface of the transfer lens support part, a first electrode voltage in the propagation direction of the charged particle beam of the first transfer lens is the extraction voltage, a second electrode voltage in the propagation direction of the charged particle beam of the first transfer lens is a pass-through voltage, a first electrode voltage in the propagation direction of the charged particle beam of the second transfer lens is the pass-through voltage, a second electrode voltage in the propagation direction of the charged particle beam of the second transfer lens is the extraction voltage.

15. The charged particle beam apparatus of claim 14, wherein the transfer lens support part is positioned in a space where a vacuum state is maintained with an evacuation pipe, and has the same potential as a lower electrode of the first transfer lens part and an upper electrode of the second transfer lens part.

16. The charged particle beam apparatus of claim 1, wherein a charged particle of the charged particle beam is an electron, and the charged particle beam exit electrode is an anode.

17. The charged particle beam apparatus of claim 16, wherein the charged particle source of the charged particle that is an electron, the suppressor, and the extractor are connected to an electron gun flange that is ground potential through an insulation material, and is connected to bellows so that adjustment in a horizontal direction and a vertical direction in vacuum is performed, such that an electron source is replaced independently from the monochromator.

18. The charged particle beam apparatus of claim 17, wherein the charged particle beam apparatus is a scanning electron microscope observing an image of a surface of the sample positioned in the sample chamber.

19. The charged particle beam apparatus of claim 17, wherein the charged particle beam apparatus is a transmission electron microscope (TEM) obtaining an image of an electron beam transmitting through the sample positioned in the sample chamber.

20. The charged particle beam apparatus of claim 17, wherein the charged particle beam apparatus is an electron beam etching apparatus etching a surface of the sample positioned in the sample chamber.

21. The charged particle beam apparatus of claim 1, wherein a charged particle of the charged particle beam is an ion, and the charged particle beam exit electrode is a cathode.

22. The charged particle beam apparatus of claim 21, wherein the charged particle beam apparatus is a focused ion beam apparatus processing a surface of the sample positioned in the sample chamber.

* * * * *